(12) United States Patent
Sugitani et al.

(10) Patent No.: US 10,027,282 B2
(45) Date of Patent: Jul. 17, 2018

(54) INTEGRATED CIRCUIT

(71) Applicant: Mitsubishi Electric Corporation, Tokyo (JP)

(72) Inventors: Takumi Sugitani, Tokyo (JP); Hitoshi Kurusu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/387,755

(22) Filed: Dec. 22, 2016

(65) Prior Publication Data

US 2017/0310279 A1 Oct. 26, 2017

(30) Foreign Application Priority Data

Apr. 20, 2016 (JP) .................................. 2016-084659

(51) Int. Cl.
*H03F 1/02* (2006.01)
*H01L 23/00* (2006.01)
(Continued)

(52) U.S. Cl.
CPC ........... *H03F 1/0205* (2013.01); *H01L 24/17* (2013.01); *H03F 1/083* (2013.01); *H03F 3/195* (2013.01); *H03F 3/4508* (2013.01); *H03F 3/187* (2013.01); *H03F 2200/222* (2013.01); *H03F 2200/387* (2013.01); *H03F 2200/408* (2013.01); *H03F 2200/451* (2013.01)

(58) Field of Classification Search
CPC ...... H03F 1/3211; H03F 3/45; H03F 3/45076; H03F 3/4508; H03F 3/45085; H03F 2203/45138; H03F 1/565; H03F 3/191; H03F 2200/222; H03F 2200/318; H03F 3/187; H03F 3/195; H03F 3/213; H03F 3/347

USPC .......... 330/98, 133, 150, 252, 302, 307, 310
See application file for complete search history.

(56) References Cited

U.S. PATENT DOCUMENTS 7,116,175 B2 * 10/2006 Shimizu .................. H01L 23/66
330/307
2009/0166739 A1 * 7/2009 Ohmi ..................... H01L 21/845
257/351
(Continued)

FOREIGN PATENT DOCUMENTS

JP    2001-156242 A    6/2001
JP    2015-080018 A    4/2015

OTHER PUBLICATIONS

Korean (KR) Office Action dated Mar. 12, 2018, from corresponding KR Appl No. 10-2017-0050169, with English translation, 8 pp.

*Primary Examiner* — Khanh V Nguyen
(74) *Attorney, Agent, or Firm* — Studebaker & Brackett PC

(57) ABSTRACT

According to the present invention, an integrated circuit includes a first amplifier stage, a second amplifier stage, a first signal line connecting an output of the first amplifier stage and an input of the second amplifier stage to each other, a first plane for ground connected to the first amplifier stage, a second plane for ground connected to the second amplifier stage and at least one at least one line for ground connecting the first plane and the second plane to each other, wherein the at least one line has a center line having a length of 10 μm to 1 mm, a width of the at least one line is ⅓ or less of a width of the first plane, and a pattern ratio is 1 or more.

7 Claims, 22 Drawing Sheets

(51) Int. Cl.
  *H03F 3/195*   (2006.01)
  *H03F 3/45*    (2006.01)
  *H03F 1/08*    (2006.01)
  *H03F 3/187*       (2006.01)

(56) References Cited

U.S. PATENT DOCUMENTS

2013/0257544 A1\* 10/2013 Takikawa ............... H01L 24/06
                                                    330/307
2014/0266470 A1\*  9/2014 Maxim .................... H03F 1/14
                                                    330/307
2015/0326183 A1\* 11/2015 Chen ....................... H03F 3/19
                                                    330/307

\* cited by examiner

US 10,027,282 B2

INTEGRATED CIRCUIT

BACKGROUND OF THE INVENTION

Field

The present invention relates to an integrated circuit and to an integrated circuit including a multistage amplifier suitably used in a high-frequency band.

Background

In an ordinary multistage amplifier including a plurality of amplifier stages are cascade-connected to each other, a signal may be fed back through a plane for ground to ground the amplifier stages. This feedback causes oscillation, and the multistage amplifier may unstably operate. Japanese laid-open patent publication No. 2001-156242 discloses, as a method of suppressing the oscillation caused by feedback, a configuration in which chip mounting patterns are separated from each other in units of amplifying devices.

In the method disclosed in Japanese laid-open patent publication No. 2001-156242, the separated chip mounting patterns must be connected to each other by wires. In this configuration, the inductances of the wires considerably influence the characteristics of the amplifier in a high-frequency band. For this reason, the circuit may be difficult to be stably operated.

SUMMARY

The present invention has been made to solve the above problem and, has as its object to obtain an integrated circuit including a multistage amplifier and being capable of suppressing feedback through a plane for ground.

The features and advantages of the present invention may be summarized as follows.

According to the present invention, an integrated circuit includes a first amplifier stage, a second amplifier stage, a first signal line connecting an output of the first amplifier stage and an input of the second amplifier stage to each other, a first plane for ground connected to the first amplifier stage, a second plane for ground connected to the second amplifier stage and at least one line for ground connecting the first plane and the second plane to each other, wherein the at least one line has a center line having a length of 10 µm to 1 mm, a width of the at least one line is ⅓ or less of a width of the first plane, and a pattern ratio which is a value obtained by dividing the length of the center line by the width of the at least one line is 1 or more.

Other and further objects, features and advantages of the invention will appear more fully from the following description.

DESCRIPTION OF EMBODIMENTS

Figure 1:
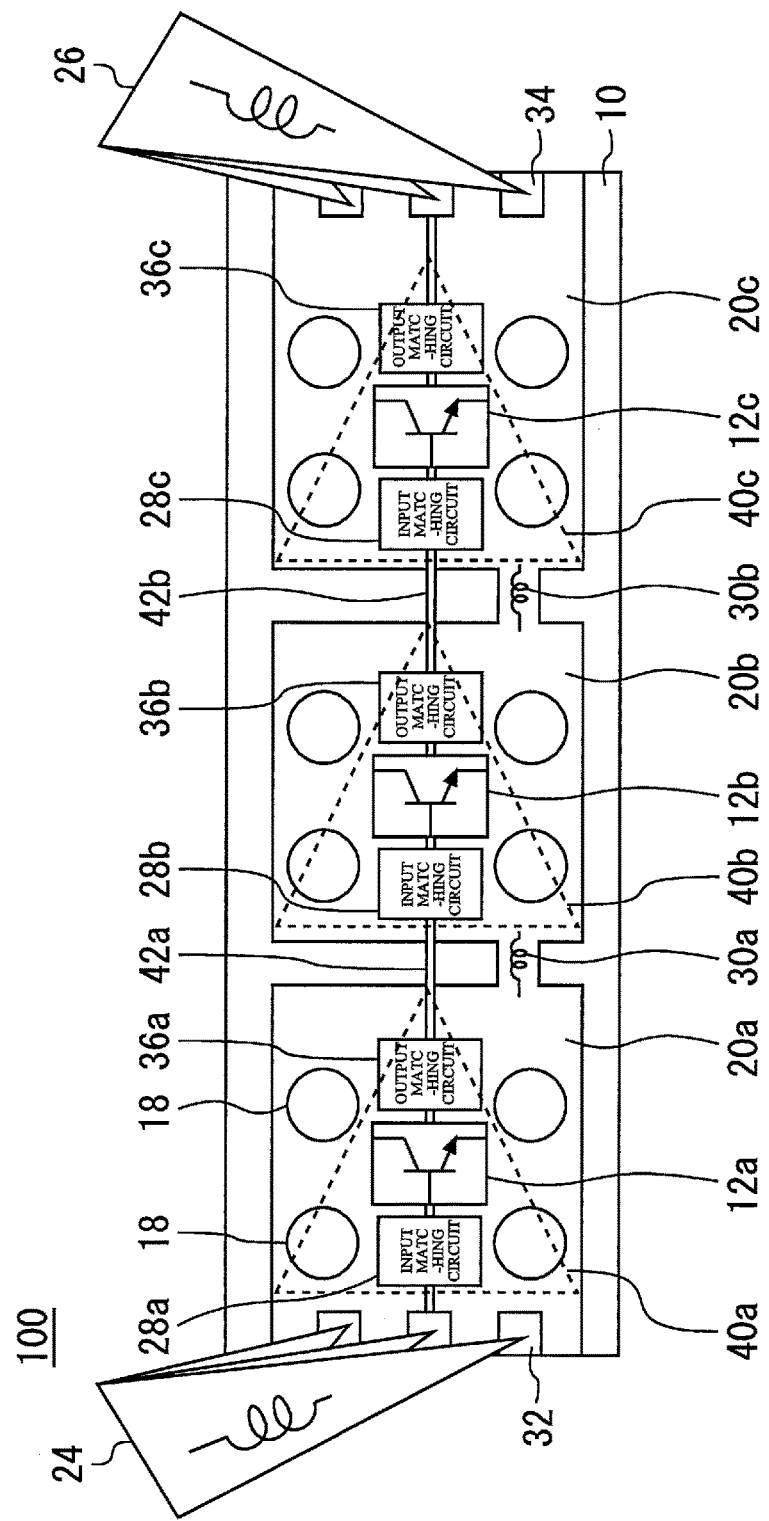
FIGS. 1 and 2 are plan views of an integrated circuit according to Embodiment 1 of the present invention.

An integrated circuit according to an embodiment of the present invention will be described with reference to the accompanying drawings. Components identical or corresponding to each other are indicated by the same reference characters, and repeated description of them is avoided in some cases.

Embodiment 1

Figure 2:
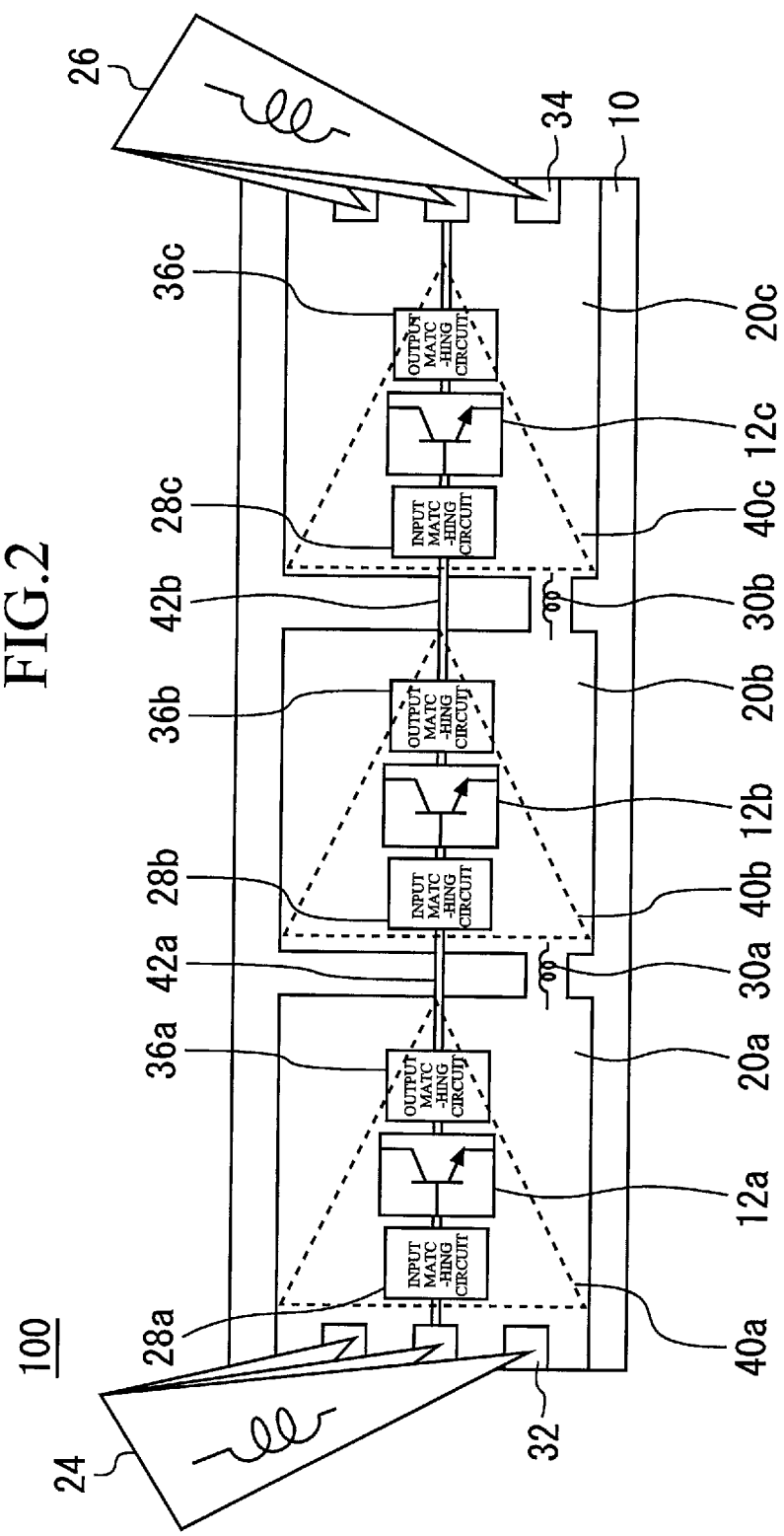

FIG. 1 and FIG. 2 are plan views of an integrated circuit according to Embodiment 1 of the present invention. As shown in FIG. 1, an integrated circuit 100 according to the present embodiment includes an input pad 32. The input pad 32 is connected to an input of a first amplifier stage 40a. The input of the first amplifier stage 40a is connected to an input of a first input matching circuit 28a. An output from the first input matching circuit 28a is input to a first transistor 12a serving as an amplifying device. An output of the first transistor 12a is connected to a first output matching circuit 36a. An output of the first output matching circuit 36a is connected to an output of the first amplifier stage 40a. The output of the first amplifier stage 40a is connected to a first signal line 42a.

The first amplifier stage 40a includes the first input matching circuit 28a, the first transistor 12a, and the first output matching circuit 36a. The output of the first amplifier stage 40a is connected to an input of a second amplifier stage 40b through the first signal line 42a. The second amplifier stage 40b has the same configuration as that of the first amplifier stage 40a. The second amplifier stage 40b includes a second input matching circuit 28b, a second transistor 12b, and a second output matching circuit 36b. An output of the second amplifier stage 40b is connected to an input of a third amplifier stage 40c through a second signal line 42b. A third amplifier stage 40c also has the same structure as that of the first amplifier stage 40a. The third amplifier stage 40c includes a third input matching circuit 28c, a third transistor 12c, and a third output matching circuit 36c. An output of the third amplifier stage 40c is connected to an output pad 34.

The first amplifier stage 40a, the second amplifier stage 40b, and the third amplifier stage 40c are single-phase-input/output amplifier stages, respectively. The first amplifier stage 40a, the second amplifier stage 40b, and the third amplifier stage 40c configure a multistage amplifier including three amplifier stages. The integrated circuit 100 mentioned here may include a multistage amplifier having amplifier stages the number of which is not limited to three. The number of amplifier stages may be two or more. Each of the first amplifier stage 40a, the second amplifier stage 40b, and the third amplifier stage 40c may include a cascade connect obtained by connecting transistors in two stages in place of the first to third transistors 12a to 12c. The first amplifier stage 40a, the second amplifier stage 40b, and the third amplifier stage 40c may be multistage amplifiers, respectively.

The first amplifier stage 40a, the second amplifier stage 40b, and the third amplifier stage 40c are disposed on a surface of a semiconductor substrate 10. A first plane 20a for ground to ground the first amplifier stage 40a is connected to the first amplifier stage 40a. The first plane 20a is disposed above the first amplifier stage 40a to overlap the first amplifier stage 40a. Similarly, a second plane 20b for ground is connected to the second amplifier stage 40b. A third plane 20c for ground is connected to the third amplifier stage 40c.

The first plane 20a and the second plane 20b are connected to each other by a first line 30a for ground. The second plane 20b and the third plane 20c are connected to each other by a second line 30b for ground.

The integrated circuit 100 includes solder bumps 18. The solder bumps 18 are also called solder balls. The solder bumps 18 have a function of inputting/outputting a signal between the integrated circuit 100 and an external circuit in mounting. The solder bump 18 has a function of connecting the first plane 20a, the second plane 20b, and the third plane 20c to the ground of a mounting substrate in mounting. FIG. 2 is a plan view of the integrated circuit 100 when the solder bumps 18 are not shown.

Figure 3A:
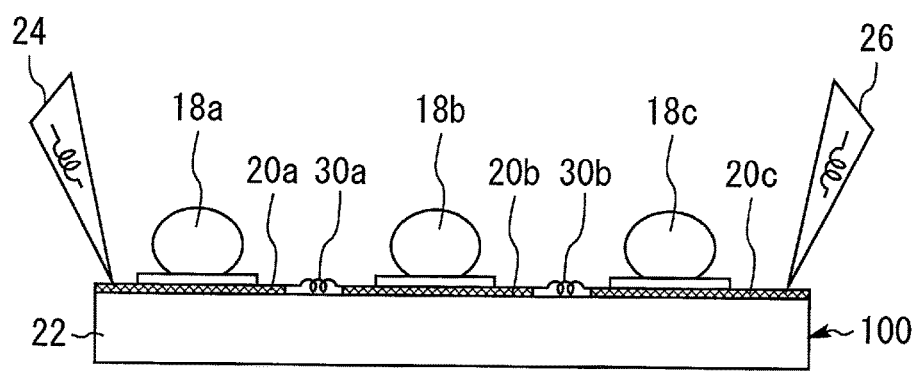
FIG. 3A is a sectional view of the integrated circuit according to Embodiment 1 of the present invention.

FIG. 3A is a sectional view of the integrated circuit according to Embodiment 1 of the present invention. The integrated circuit 100 includes a semiconductor circuit forming layer 22. The semiconductor circuit forming layer 22 includes the semiconductor substrate 10, the first amplifier stage 40a, the second amplifier stage 40b, the third amplifier stage 40c, the first signal line 42a, and the second signal line 42b. On a surface of the semiconductor circuit forming layer 22, the first plane 20a, the second plane 20b, the third plane 20c, the first line 30a, and the second line 30b are disposed. On surfaces of the first plane 20a, the second plane 20b, and the third plane 20c, solder bumps 18a, 18b, and 18c are disposed, respectively. In this case, in FIG. 3A and FIG. 3B, of the bumps 18, only the solder bumps 18a, 18b, and 18c for grounding are shown.

On the surface of the first plane 20a, the input pad 32 is disposed. On the surface of the third plane 20c, the output pad 34 is disposed. In on-wafer measurement, signals are input to the input pad 32 to execute a measurement. In on-wafer measurement, signals are output from the output pad 34 to execute a measurement. FIG. 3A shows a state in which probe heads 24 and 26 are brought into contact with the input pad 32 and the output pad 34. At this time, the signals are input/output between the integrated circuit 100 and signals units included in the probe heads 24 and 26.

Figure 3B:
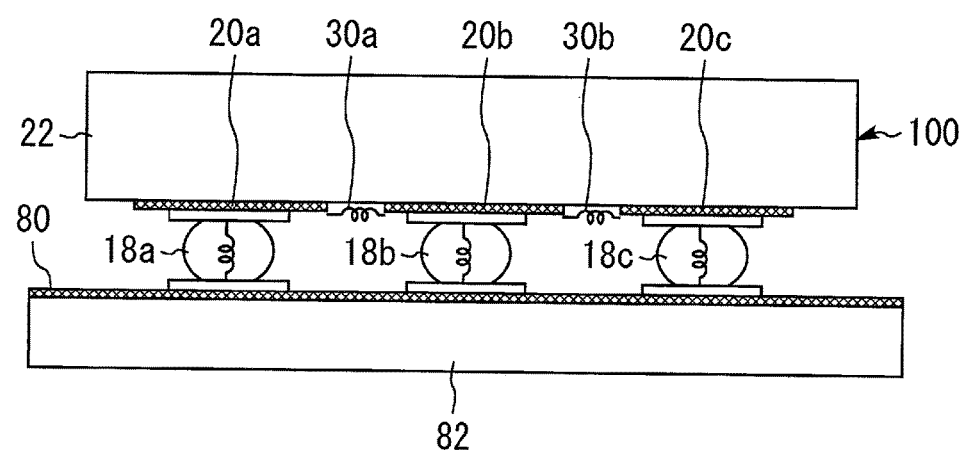
FIG. 3B is a sectional view of the integrated circuit according to Embodiment 1 of the present invention in mounting.

FIG. 3B is a sectional view of the integrated circuit according to Embodiment 1 of the present invention in mounting. In FIG. 3B, the integrated circuit 100 is mounted on a mounting substrate 82. In mounting, the solder bumps 18a, 18b, and 18c are connected to a ground 80 included in the mounting substrate 82. As a mounting method, flip-chip mounting is used. In mounting, the first plane 20a, the second plane 20b, and the third plane 20c are commonly grounded on the ground 80 of the mounting substrate 82 through the solder bumps 18a, 18b, and 18c, respectively. In this case, in FIG. 3A and FIG. 3B, one solder bump is connected to one plane for ground. In contrast to this, each of the planes for ground may be connected to a plurality of solder bumps.

Figure 4:
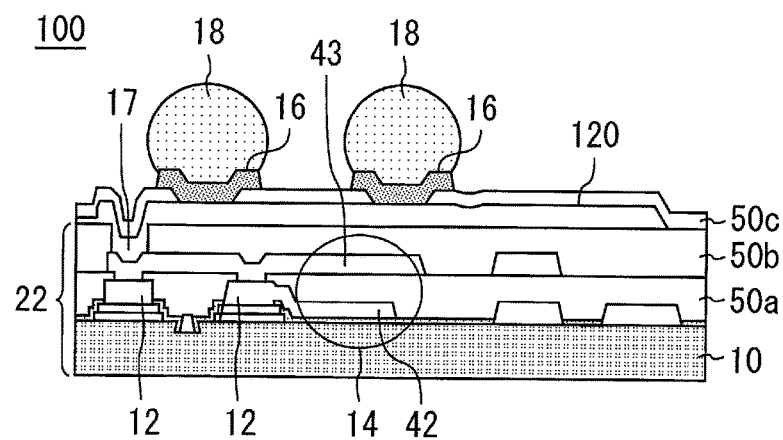
FIG. 4 is a sectional view of the integrated circuit according to Embodiment 1 of the present invention.

FIG. 4 is a sectional view of the integrated circuit according to Embodiment 1 of the present invention. The integrated circuit 100 is a chip-scale package type MMIC (Monolithic Microwave Integrated Circuit). The integrated circuit 100 includes the semiconductor substrate 10. The semiconductor substrate 10 is made of GaAs. On a surface of the semiconductor substrate 10, a three-layered multilayered wiring structure is formed. FIG. 4 is a sectional view obtained by cutting the integrated circuit 100 along a line connecting the first line 30a to the second line 30b.

In the multilayered wiring structure, the transistors 12 are disposed on the lowermost layer disposed on a surface of the semiconductor substrate 10. In this case, in the sectional view, some of the first to third transistors 12a to 12c included in the integrated circuit 100 are shown. The signal line 42 connecting the transistors 12 to each other is disposed on the lowermost layer. On the lowermost layer, an MIM (Metal-Insulator-Metal) capacitor (not shown) and a spiral inductor (not shown) are also formed. On an intermediate layer disposed on the surface of the lowermost layer, a power source wire 43 to supply an electric power to the transistors 12 is disposed. A layer 120 for ground is disposed on an uppermost layer disposed on the surface of the intermediate layer. The layer 120 includes the first to third planes 20a to 20c, the first line 30a, and the second line 30b. The signal line 42 and the power supply wire 43 configure a wiring layer 14.

Dielectric films 50a, 50b, and 50c are disposed between the layers and on the surface of the uppermost layer in the multilayered wiring structure. The transistor 12, the signal line 42, the MIM capacitor (not shown), and the spiral inductor (not shown) which are disposed on the lowermost layer are covered with the dielectric film 50a. The power supply wire 43 is covered with the dielectric film 50b. The layer 120 is covered with the dielectric film 50c. The material of the dielectric films 50a, 50b, and 50c is a dielectric material such as polyimide. In FIG. 3A and FIG. 3B, for the sake of convenience, the dielectric film 50c disposed on the surface of the layer 120 is not shown.

The dielectric film 50c has a plurality of openings. The openings allow the first to third planes 20a to 20c included in the layer 120 to be exposed. On the surface of the dielectric film 50c, under-bump metals 16 are disposed to bury the openings. The under-bump metals 16 are in contact with the first to third planes 20a to 20c in the openings. The solder bumps 18 are arranged on the surfaces of the under-bump metals 16. Thus, the first to third planes 20a to 20c are connected to the solder bumps 18 through the under-bump metals 16. In this case, in FIG. 4, some of the under-bump metals 16 and some of the solder bumps 18 are shown.

The integrated circuit 100 includes connection structures 17 connecting the layer 120 to the transistors 12. In the integrated circuit 100, the dielectric films 50a and 50b have openings. The openings allow the transistors 12 to be exposed. The openings are buried with the layer 120 to form the connection structures 17. In this case, although only one connection structure 17 is shown in FIG. 4 for the sake of convenience, the integrated circuit 100 includes three connection structures 17 including a first connection structure, a second connection structure, and a third connection structure.

In the multilayered wiring structure, the first amplifier stage 40a and the first plane 20a are connected to each other by the first connection structure. Similarly, the second amplifier stage 40b and the second plane 20b are connected to each other by the second connection structure. The third amplifier stage 40c and the third plane 20c are connected to each other by the third connection structure. As described above, the solder bumps 18, the layer 120, and the transistors 12 are connected to each other. The semiconductor substrate 10, the lowermost layer, and the intermediate layer form the semiconductor circuit forming layer 22.

In the multilayered wiring structure in FIG. 4, the first to third planes 20a to 20c, the first line 30a, and the second line 30b are disposed on the same layer. In this manner, the planes for ground and the lines for ground can be formed by one metal layer such that a pattern ratio is adjusted.

The integrated circuit 100 is a chip-scale package type MMIC in which the solder bumps 18 are arranged at a predetermined pitch. In this case, the integrated circuit 100 according to the present invention is not limited to a chip-scale package. The integrated circuit 100 can also be applied to a flip-chip mounting package in which the positions of the solder bumps 18 are not limited. Although FIG. 4 shows the three-layered multilayered wiring structure, the number of layers of the multilayered wiring structure is not limited to three in the integrated circuit 100.

An operation of the integrated circuit 100 will be described below. An operation in on-wafer measurement will be described here. A high-frequency signal is input from the signal unit of a probe head 24 to the input pad 32. This high-frequency signal is amplified by the first amplifier stage 40a. Thus, a signal the electric power of which is amplified is output from the first amplifier stage 40a rather than the signal input to the input pad 32. The signal output from the first amplifier stage 40a is input to the second amplifier stage 40b through the first signal line 42a. The second amplifier stage 40b further amplifies the electric power of the signal. Similarly, the third amplifier stage 40c further amplifies the electric power of the signal. In this manner, the high-frequency signal electric power of the input signal to the first amplifier stage 40a gradually increases toward downstream stages. The signal amplified to an output electric power level is output from the output pad 34. This output signal is measured by a probe head 26.

In the present embodiment, each of the amplifier stages is grounded through an independent plane for ground. The planes for ground are connected to each other by lines for ground. In contrast to this, as a method of grounding the multistage amplifier, a method of forming a common plane for ground for the amplifier stages is conceived. However, in the structure in which the common plane for ground is connected to a plurality of amplifier stages, feedback through the plane for ground may cause oscillation. This phenomenon will be described below with reference to FIGS. 5 to 6.

Figure 5:
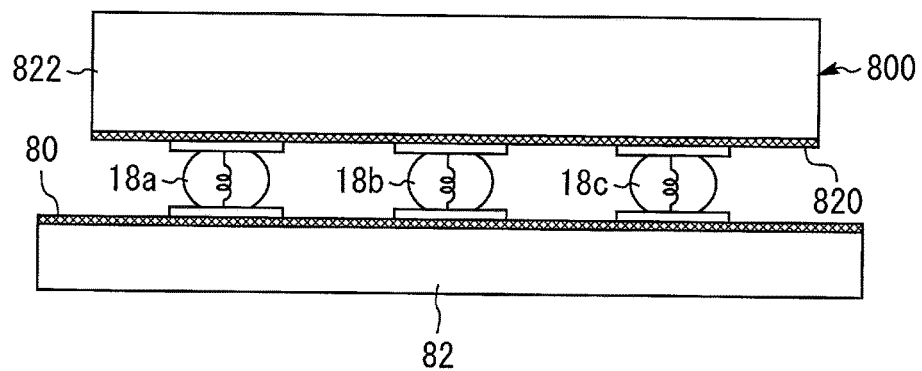
FIG. 5 is a sectional view of an integrated circuit according to a comparative embodiment in mounting.

FIG. 5 is a sectional view of an integrated circuit according to a comparative embodiment in mounting. An integrated circuit 800 according to the comparative embodiment is different from the integrated circuit 100 in that a plane 820 for ground is not separated. In FIG. 5, the integrated circuit 800 is mounted on the mounting substrate 82. As in FIG. 3B, the integrated circuit 800 is flip-chip-mounted at a predetermined position on the mounting substrate 82 by the plurality of solder bumps 18a, 18b, and 18c. As a result, the solder bumps 18a, 18b, and 18c are connected to the ground 80 included in the mounting substrate 82. Thus, the plane 820 and the ground 80 are commonly grounded.

Figure 6A:
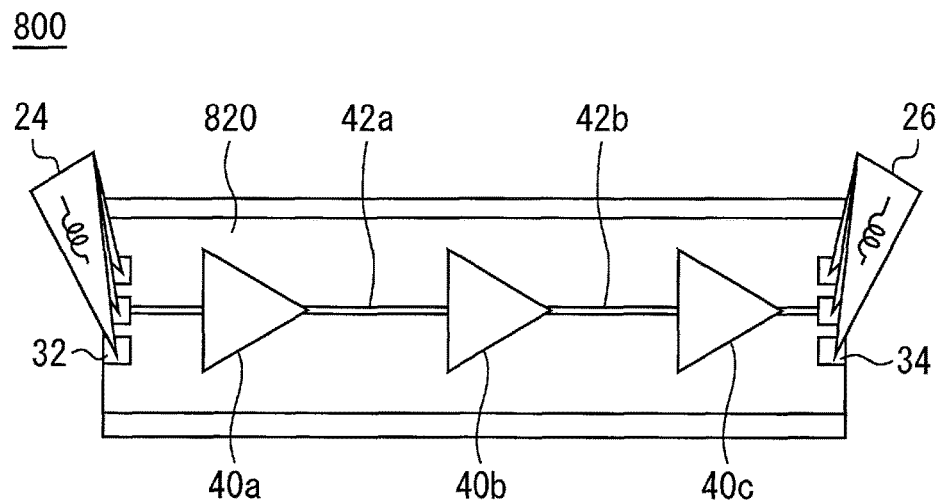
FIG. 6A is a plan view of the integrated circuit according to the comparative embodiment.

FIG. 6A is a plan view of the integrated circuit according to the comparative embodiment. In the integrated circuit 800 according to the comparative embodiment, the first amplifier stage 40a, the second amplifier stage 40b, and the third amplifier stage 40c are connected to the common plane 820. In this case, the first amplifier stage 40a, the second amplifier stage 40b, and the third amplifier stage 40c are denoted by triangles for the sake of convenience. Also in the following drawings, the amplifier stages are similarly denoted by triangles.

Figure 6B:
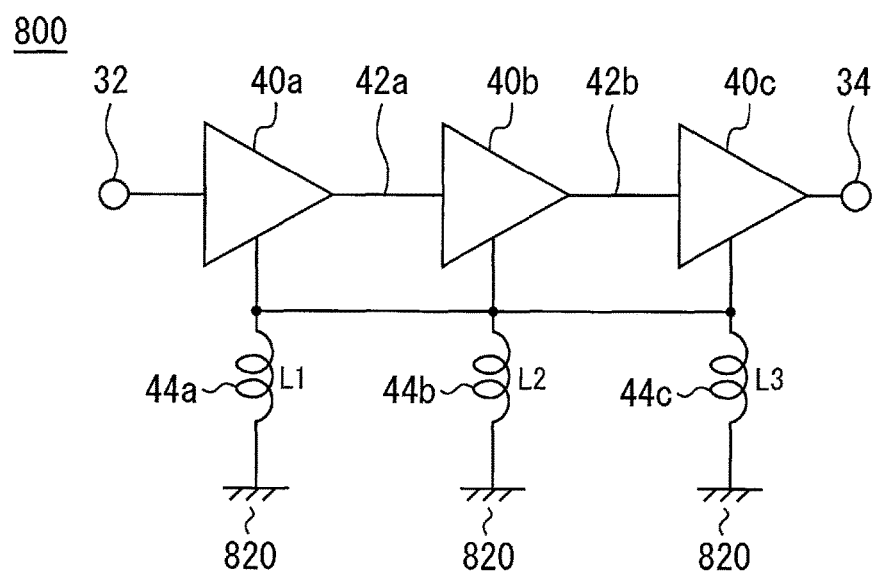
FIG. 6B is an equivalent circuit diagram of the integrated circuit according to the comparative embodiment.

FIG. 6B is an equivalent circuit diagram of the integrated circuit according to the comparative embodiment. In the equivalent circuit of the integrated circuit 800 according to the comparative embodiment, the first amplifier stage 40a is connected to one end of an inductor L1. The other end of the inductor L1 is grounded on the plane 820. Similarly, the second amplifier stage 40b is connected to one end of an inductor L2. The other end of the inductor L2 is grounded on the plane 820. The third amplifier stage 40c is connected to one end of an inductor L3. The other end of the inductor L3 is grounded on the plane 820.

The inductor L1 exhibits a first inductance 44a which is an inductance component between the first amplifier stage 40a and the plane 820. Similarly, the inductor L2 exhibits a second inductance 44*b* which is an inductance component between the second amplifier stage 40*b* and the plane 820. The inductor L3 exhibits a third inductance 44*c* which is an inductance component between the third amplifier stage 40*c* and the plane 820. The plane 820 is commonly connected to all the amplifier stages. For this reason, in the equivalent circuit, one ends of the inductors L1, L2, and L3 are short-circuited.

As described above, in the integrated circuit 800, the amplifier stages are connected to a common ground. The amplifier stages are connected to the ground through the inductances. The multistage amplifier having the above structure may unstably operate. This phenomenon will be described below by using a simplified model.

S parameters of a model of an amplifier are defined as the following equation. In this case, the amplifier corresponds to each of the amplifier stages of the integrated circuit 800.

[Numerical Expression 1]

$$\begin{bmatrix} S_{11} & S_{12} \\ S_{21} & S_{22} \end{bmatrix} = \begin{bmatrix} 0 & 0 \\ G & 0 \end{bmatrix} \quad (1)$$

At this time, Z parameters of the amplifier are given by the following equation.

[Numerical Expression 2]

$$\begin{bmatrix} Z_{11} & Z_{12} \\ Z_{21} & Z_{22} \end{bmatrix} = \begin{bmatrix} 1 & 1 \\ 2G & 1 \end{bmatrix} \quad (2)$$

Note that Equation (2) is standardized by Zo (50Ω). A Z parameter Zind obtained by loading a reactance jX on the ground is given by the following equation. In this case, the reactance jX is standardized with Zo.

[Numerical Expression 3]

$$\begin{bmatrix} Zind_{11} & Zind_{12} \\ Zind_{21} & Zind_{22} \end{bmatrix} = \begin{bmatrix} 1+jX & jX \\ 2G+jX & 1+jX \end{bmatrix} \quad (3)$$

On the basis of this equation, a stability factor K is calculated as the following equation by using the Z parameter Zind.

[Numerical Expression 4]

$$K = (2Re(Zind_{11})Re(Zind_{22}) - Re(Zind_{12}Zind_{21})) / |Zind_{12}Zind_{24}| \quad (4)$$

Here, when expression (3) is assigned to expression (4), the stability factor K can be expressed by a gain G and a reactance X. In this case, the stability factor K takes different actions depending on phase conditions of the gain G. The stability factor K becomes maximally unstable when the gain G is a negative pure imaginary number. This negative pure imaginary number is expressed by G=−ja. Reference symbol a is a positive real number. When the gain G=−ja is used, the stability factor K is expressed by the following expression.

$$K = 1/X(a-X2) - 1 \quad (5)$$

$$\approx 1/Xa - 1 \quad (6)$$

In general, when an amplifier path is used in a microwave or millimetric-wave band, a>>X is satisfied. Thus, expression (5) can be approximated to expression (6). In expression (6), the stability factor K decreases when the reactance component increases with respect to an amplifier having the gain G=−ja to exhibit an increase in destabilization. In this case, when the stability factor is larger than 1, the operation of the amplifier is regarded to be stable. On the basis of expression (6), a conditional expression of a reactance having the stability factor K of 1 or less is given by the following expression.

[Numerical Expression 6]

$$X \geq \frac{1}{2}a \quad (7)$$

Although the stability factor K has been described above, a reflection gain (|S11|>1) is generated when the reactance X increases. The operation of the amplifier is also destabilized by the generation of the reflection gain (|S11|>1). In this case, a reactance component loaded on a plane for ground is caused by an inductance of a via hole in a rear surface process including a via hole process for a through hole. In an upper surface process, an inductance of wires and solder bumps are main components of the reactance. In this manner, the reactance X can be expressed as X=2πfL/Zo by using a frequency f and an inductance L. Thus, a condition for an inductance having the stability factor K which is given by expression (6) and 1 or less is given by the following expression.

[Numerical Expression 7]

$$L \geq 50/4\pi fa \quad (8)$$

A phenomenon expressed by expression (8) will be described below. It is assumed that an amplifier having a gain G of 20 dB has the inductance L. When the two amplifiers are connected in series with each other, the total gain is 40 dB. The inductance becomes L/2. In this case, on the basis of expression (8), when the total gain is 40 dB, in order to obtain the same stability factor K as that obtained when the total gain is 20 dB, the inductance must be $\frac{1}{10}$. However, in general, the inductance decreases to ½ at most. Thus, on the basis of expression (8), it is understood that the operation of the amplifier is unstable when the two amplifiers are connected in series with each other more than when one amplifier is connected. Thus, a structure in which a plurality of amplifiers each having a high total gain have one plane for ground unstably operates.

As described above, a structure in which a plurality of amplifier stages which are cascade-connected as in the integrated circuit 800 are connected to one plane for ground unstably operates. This is because reactance components between the amplifier stages and the plane for ground commonly act. At this time, oscillation caused by feedback may occur.

A simulation result about the equivalent circuit shown in FIG. 6B will be described below. Table 1 shows a set value of each inductance used in the simulation. In Table 1, units of inductances of the inductors L1 to L3 are expressed by pH. A total gain of the integrated circuit was set to 40 dB, and a frequency was set to 77 GHz. Furthermore, expression (1) was used as a model of an amplifier, and a phase condition of the gain G was given as a negative pure imaginary number. A simulation in the following embodiment is executed under the same conditions as described above.

TABLE 1

| Inductor | L1 | L2 | L3 |
|---|---|---|---|
| pH | 6.9 | 6.9 | 6.9 |

Figure 7:
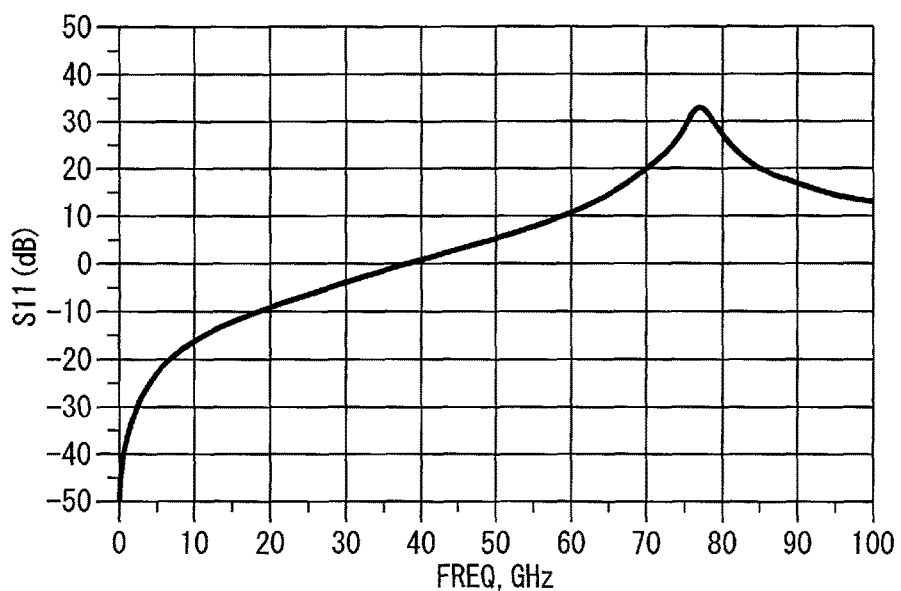
FIG. 7 is a graph showing a reflection coefficient S11 of the integrated circuit according to the comparative embodiment.
Figure 8:
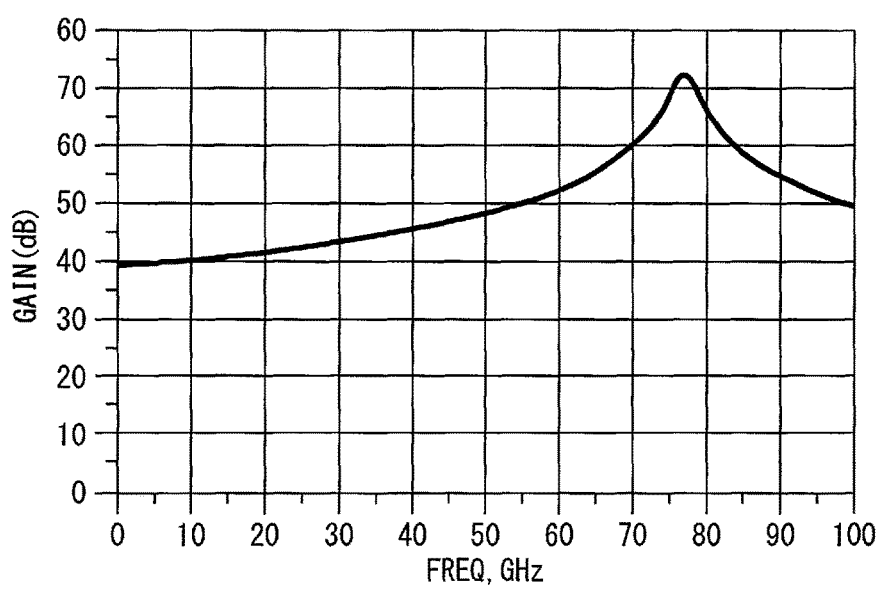
FIG. 8 is a graph showing a gain of the integrated circuit according to the comparative embodiment.
Figure 9:
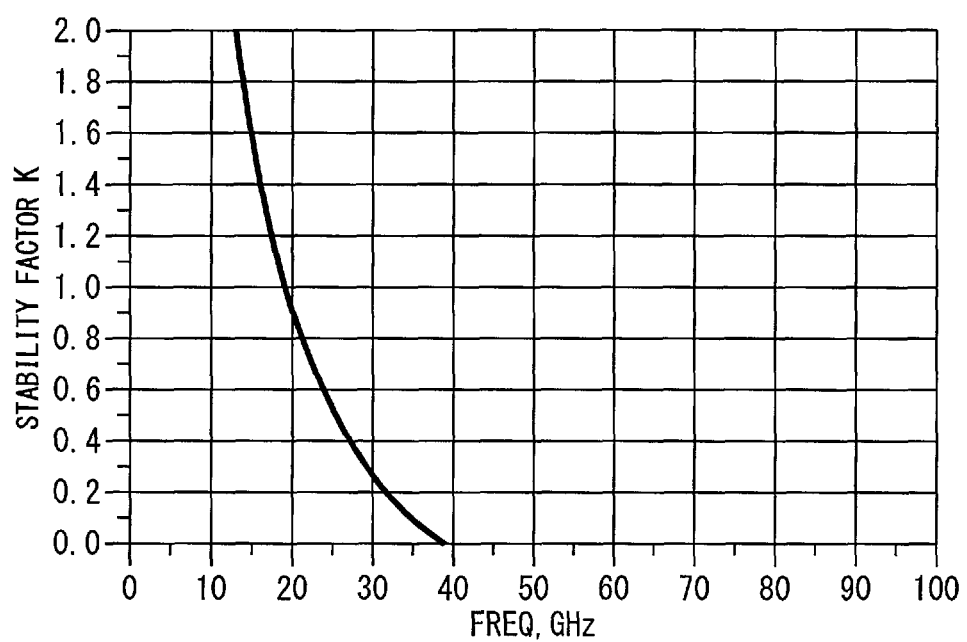
FIG. 9 is a graph showing a stability factor K of the integrated circuit according to the comparative embodiment.

FIGS. 7 to 9 show simulation results about the reflection coefficient S11, the gain G and the stability factor K of the integrated circuit 800. FIG. 7 is a graph showing a reflection coefficient S11 of the integrated circuit according to the comparative embodiment. FIG. 8 is a graph showing a gain of the integrated circuit according to the comparative embodiment. FIG. 9 is a graph showing the stability factor K of the integrated circuit according to the comparative embodiment. As shown in FIG. 7, a reflection gain is generated when the frequency f is almost 77 GHz. As shown in FIG. 8, the gain G becomes sharp. Furthermore, as shown in FIG. 9, the stability factor K decreases with an increase in frequency f, and the stability factor K becomes 1 or less when the frequency is almost 20 GHz. When a parameter value a=100 and L=2.3 pH are assigned to expression (6) to calculate the stability factor K, the stability factor K is 1 or less, at the frequency f which is almost 20 GHz or more. Thus, even in equation (6), the same result as the simulation result can be obtained.

As described above, in an integrated circuit in which one plane 820 is commonly connected to all the amplifier stages, the stability factor K decreases, and the reflection gain |S11| is generated. Thus, the integrated circuit unstably operates. This is because an inductance component acting on the common plane 820 causes feedback through the plane 820 in the plurality of amplifier stages.

In this case, in a differential amplifying circuit, a ground is a virtual ground in terms of a high-frequency signal. For this reason, the characteristics of the high-frequency signal are not easily influenced by an impedance loaded on the ground. Thus, the feedback through the plane for ground less influences the differential amplifying circuit. In a single-phase-input/output amplifier stage, an impedance loaded on a ground largely influences the characteristics of a high-frequency signal. For this reason, feedback through a plane for ground is a problematic phenomenon in the single-phase-input/output amplifier stage. Furthermore, the phenomenon easily occurs when a total gain is 30 dB or more in an integrated circuit in which amplifier stages operating in a millimetric-wave band are mounted on the same chip.

Figure 10A:
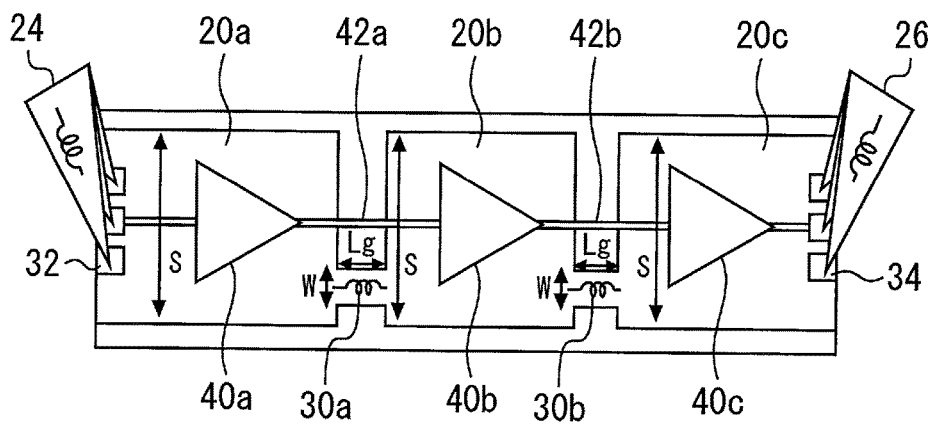
FIG. 10A is a plan view of the integrated circuit according to Embodiment 1 of the present invention.
Figure 10B:
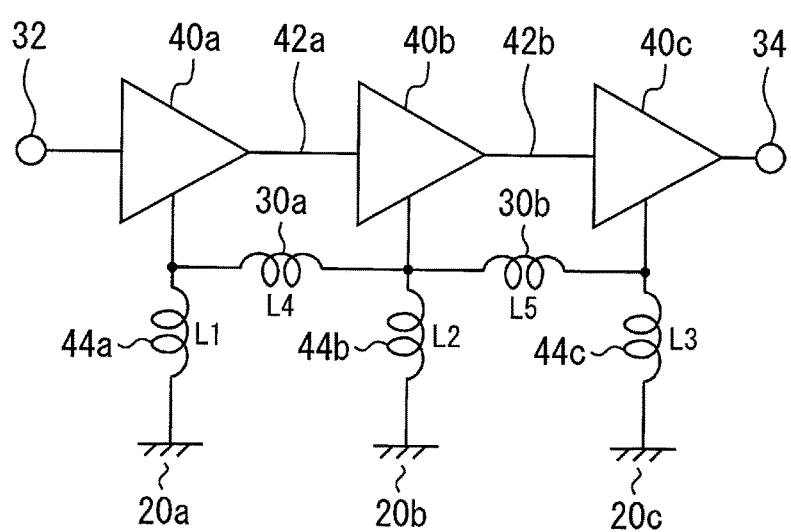
FIG. 10B is an equivalent circuit diagram of the integrated circuit according to Embodiment 1 of the present invention.

A simulation result about the integrated circuit 100 according to the present embodiment will be described below. FIG. 10A is a plan view of the integrated circuit according to Embodiment 1 of the present invention. FIG. 10B is an equivalent circuit diagram of the integrated circuit according to Embodiment 1 of the present invention. As shown in FIG. 10B, in the equivalent circuit of the integrated circuit 100, the first amplifier stage 40a is connected to one end of the inductor L1. The other end of the inductor L1 is grounded on the first plane 20a. Similarly, the second amplifier stage 40b is connected to one end of the inductor L2. The other end of the inductor L2 is grounded on the second plane 20b. The third amplifier stage 40c is connected to one end of the inductor L3. The other end of the inductor L3 is grounded on the third plane 20c.

The inductor L1 exhibits the first inductance 44a which is an inductance component between the first amplifier stage 40a and the first plane 20a in the equivalent circuit. Similarly, the inductor L2 exhibits the second inductance 44b which is an inductance component between the second amplifier stage 40b and the second plane 20b. The inductor L3 exhibits the third inductance 44c which is an inductance component between the third amplifier stage 40c and the third plane 20c.

In the present embodiment, the planes for ground connected to the amplifier stages are separated from each other. Furthermore, the planes for ground are connected to each other by the lines for ground. For this reason, in the equivalent circuit of the integrated circuit 100, one ends of the inductors L1, L2, and L3 are connected to each other by the lines for ground each having a finite impedance. One ends of the inductor L1 and the inductor L2 are connected to each other by the first line 30a. One ends of the inductor L2 and the inductor L3 are connected to each other by the second line 30b. In this case, in the equivalent circuit, the first line 30a and the second line 30b are expressed as inductances L4 and L5, respectively.

The impedance of the line for ground will be described below. As shown in FIG. 6B, when a common plane for ground is used, it is regarded that the planes for ground should be short-circuited. Thus, the impedance of the line for ground is 0Ω. As another method of suppressing signal feedback, a structure in which chip mounting patterns are separated from each other in units of amplifying devices is conceived. In the structure, the planes for ground are regarded to be open. At this time, the impedance of the line for ground is ∞Ω.

In this case, in the structure in which chip mounting patterns are separated from each other in units of amplifying devices, oscillation caused by feedback can be suppressed. On the other hand, the chip mounting patterns must be connected to each other by wires. In a microwave or millimetric-wave band, characteristics are largely influenced by the inductances of the wires. Thus, in this structure, the amplifying devices cannot be easily stably operated. In addition, when the frequency increases, each of the amplifies decreases in size. In the structure in which the chip mounting patterns are separated from each other, spaces to separate the patterns from each other are required. For this reason, although the amplifiers decrease in size, the entire integrated circuit may be prevented from being reduced in size.

As described above, the impedance of the line for ground is 0Ω, feedback occurs. When the impedance is ∞Ω, the feedback can be suppressed. Thus, a boundary between a condition satisfied to stabilize an operation of a multistage amplifier and a condition satisfied to destabilize the operation means that the impedance of the line for ground falls within the range of 0Ω to ∞Ω. More specifically, the planes for ground are connected to each other through an inductance component having a sufficiently high impedance at an applied frequency to make it possible to stably operate the multistage amplifier. At this time, oscillation caused by feedback can be suppressed without using separated chip mounting patterns.

In order to stably operate the integrated circuit 100, conditions which should be satisfied by the first line 30a and the second line 30b will be examined. In the present embodiment, the shape of each of the lines for ground is adjusted such that the impedance of each of the lines for ground satisfies the condition satisfied to stabilize the operation of the multistage amplifier. The inductance component of one line for ground is determined by a length Lg and a width W of the line for ground. In general, the size of a flip-chip mounting millimetric-wave MMIC is about several millimeters. For this reason, the length of a signal line connecting the amplifier stages is approximately several micromillimeters to several millimeters. Under the condition of this, in order to obtain sizes suitable for the first line 30a and the second line 30b, simulation about the reflection coefficient S11, the gain G and the stability factor K was performed. This simulation used the equivalent circuit shown in FIG. 10B.

Figure 11:
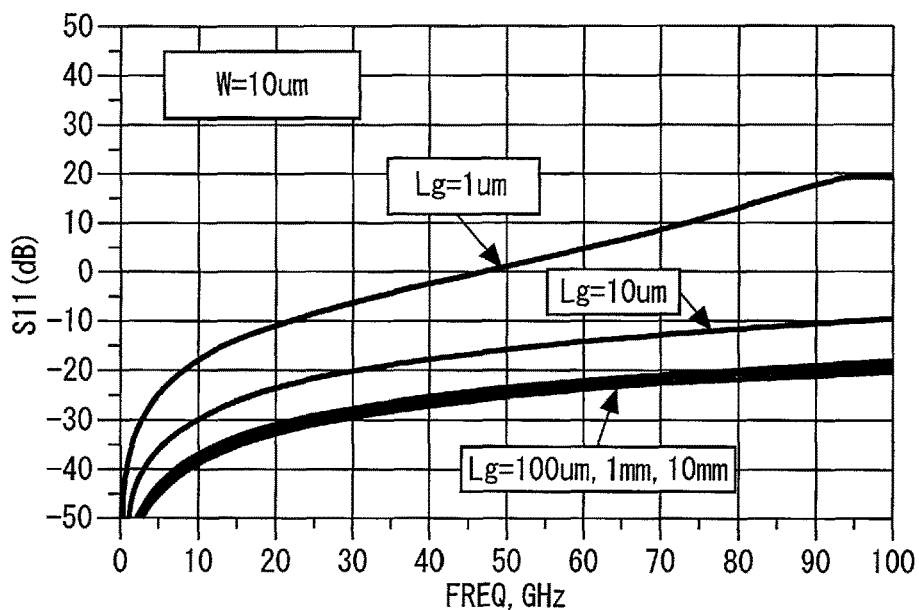
FIG. 11 is a graph showing a reflection coefficient S11 of the integrated circuit according to Embodiment 1 of the present invention.
Figure 12:
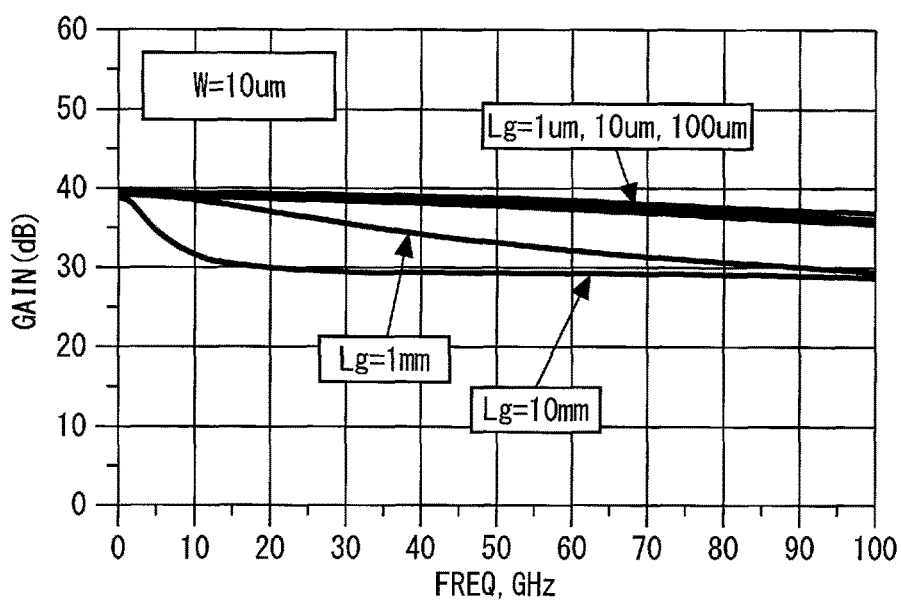
FIG. 12 is a graph showing a gain of the integrated circuit according to Embodiment 1 of the present invention.
Figure 13:
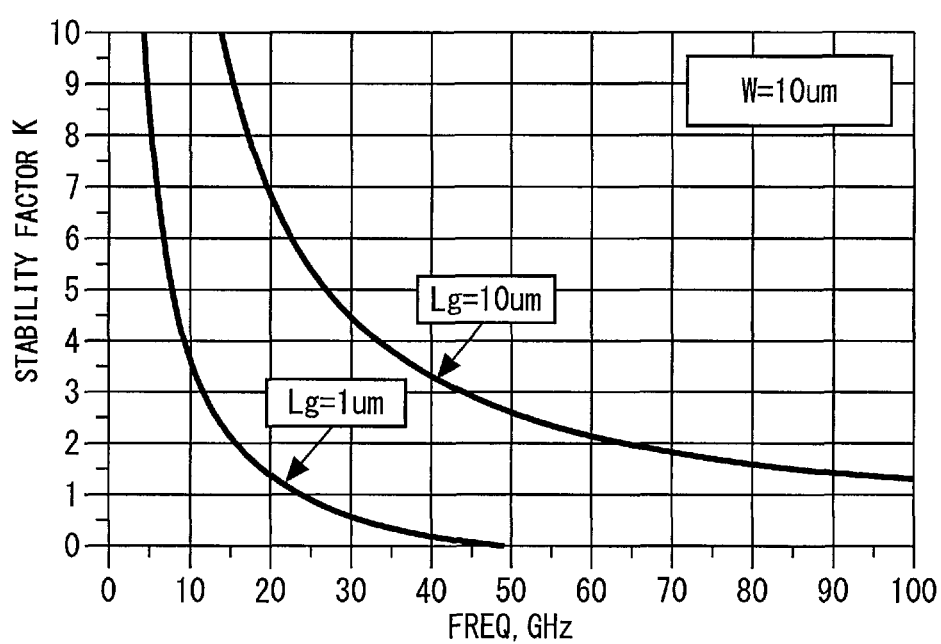
FIG. 13 is a graph showing a stability factor K of the integrated circuit according to Embodiment 1 of the present invention.

FIGS. 11 to 13 show simulation results about the reflection coefficient S11, the gain G, and the stability factor K of the integrated circuit 100. FIG. 11 is a graph showing the reflection coefficient S11 of the integrated circuit according to Embodiment 1 of the present invention. FIG. 12 is a graph showing a gain of the integrated circuit according to Embodiment 1 of the present invention. FIG. 13 is a graph showing the stability factor K of the integrated circuit according to Embodiment 1 of the present invention. In FIGS. 11 to 13, the width W of the first line 30a and the second line 30b is fixed to 10 µm, and the length Lg is changed within the range of 1 µm to 10 mm.

As shown in FIG. 11, when the length Lg is 10 µm or more, the reflection coefficient S11 is small. In addition, as shown in FIG. 12, it is understood that the gain G of 77 GHz decreases by about 10 dB when the length Lg is 1 mm or more. Furthermore, as shown in FIG. 13, the stability factor K at 77 GHz is 1 or more when the length Lg=10 µm. In this case, a case in which the length Lg is 100 µm or more will not be described because it is apparent that, when the length Lg is 100 µm or more, the stability factor K is 1 or more.

Figure 14:
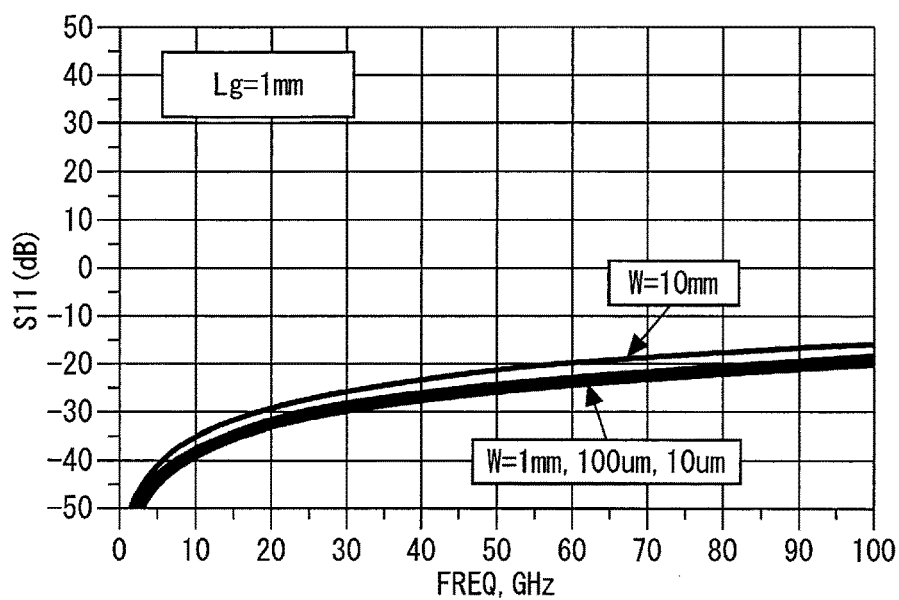
FIG. 14 is a graph showing the reflection coefficient S11 of the integrated circuit according to Embodiment 1 of the present invention.
Figure 15:
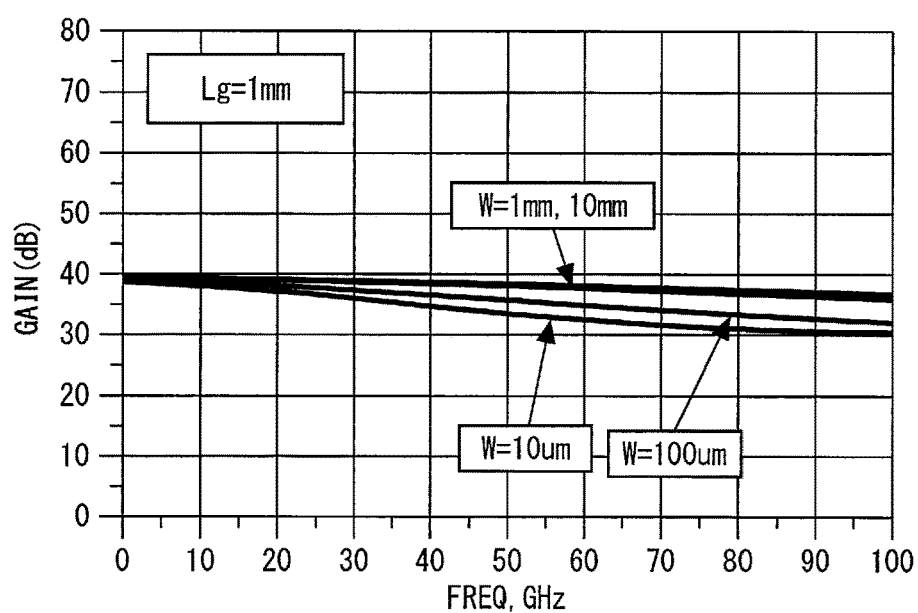
FIG. 15 is a graph showing the gain of the integrated circuit according to Embodiment 1 of the present invention.
Figure 16:
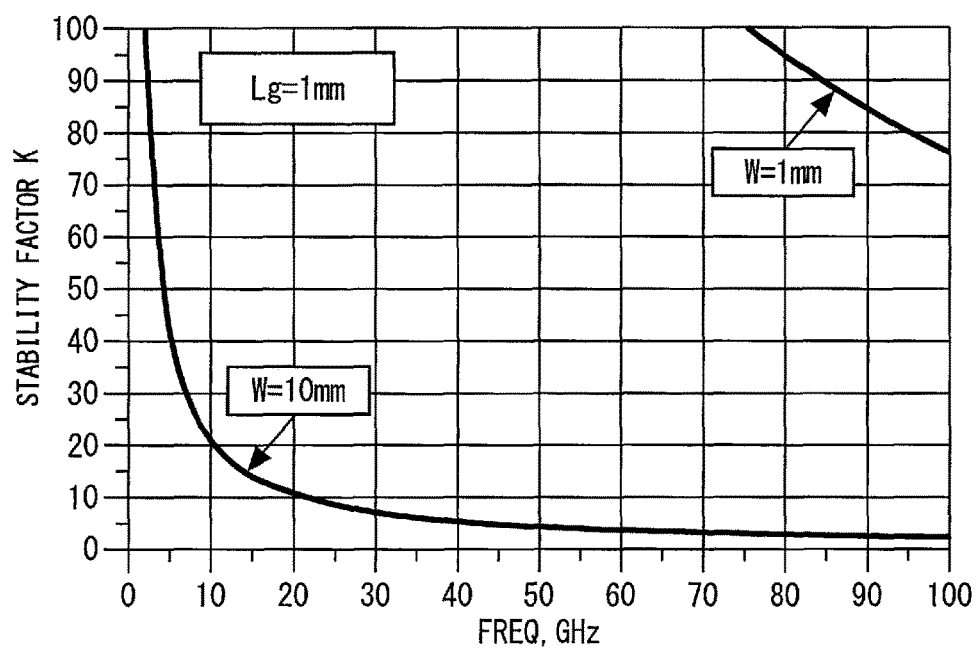
FIG. 16 is a graph showing the stability factor K of the integrated circuit according to Embodiment 1 of the present invention.

FIG. 14 is a graph showing the reflection coefficient S11 of the integrated circuit according to Embodiment 1 of the present invention. FIG. 15 is a graph showing the gain of the integrated circuit according to Embodiment 1 of the present invention. FIG. 16 is a graph showing the stability factor K of the integrated circuit according to Embodiment 1 of the present invention. In FIGS. 14 to 16, the lengths Lg of the first line 30a and the second line for ground 30b are fixed to 1 mm, and the widths W are changed within the range of 10 µm to 10 mm.

As shown in FIG. 14, the reflection coefficient obtained when the width W is 10 mm or more is larger than that obtained when the width W is 1 mm or less. As shown in FIG. 15, when the width W is 10 µm or less, the gain G at 77 GHz decreases by about 10 dB. Furthermore, as shown in FIG. 16, the stability factor K obtained when the width W is 10 mm or more is smaller than that obtained when the width W is 1 mm or less.

According to the above simulation, it is understood that, when a pattern ratio Lg/W of each of the first line 30a and the second line 30b is 1 or more and the length Lg falls within the range of 10 µm to 1 mm, the integrated circuit 100 can be stably operated. In this case, the pattern ratio Lg/W is a value obtained by dividing the length Lg by the width W. The lower limit of the width W to stably operate the integrated circuit 100 is 1 µm.

Figure 17:
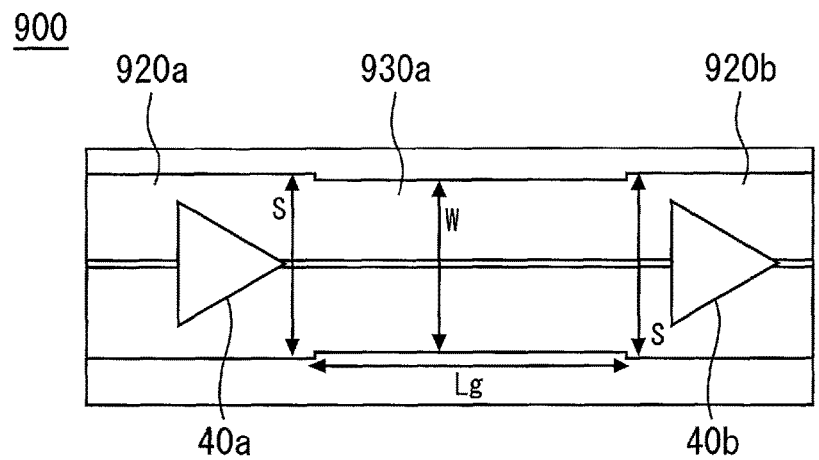
FIG. 17 is a plan view of an integrated circuit according to a comparative embodiment.

In the simulation results shown in FIGS. 11 to 16, it is assumed that the areas of the first to third planes 20a to 20c are infinite. However, the actual first to third planes 20a to 20c have finite sizes. FIG. 17 is a plan view of an integrated circuit according to a comparative embodiment. In the integrated circuit 900 shown in FIG. 17, a first line 930a for ground has the width W equivalent to a width S of a first plane 920a for ground and a second plane 920b for ground. In this structure, the line for ground is not regarded as a line with respect to the planes for ground on both the sides. At this time, even though the line for ground satisfies the conditions shown in FIGS. 11 to 16, the advantageous effect of the present invention cannot be obtained. A condition satisfied to regard the line for ground as a line with respect to the planes for ground adjacent to the line for ground will be described below.

Figure 18:
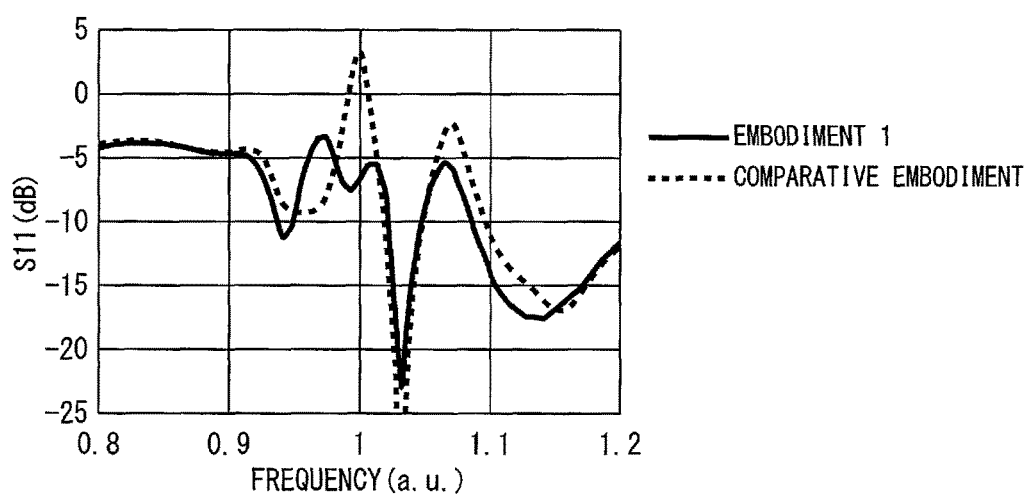
FIG. 18 is a graph showing the reflection coefficient S11 of the integrated circuit according to Embodiment 1 of the present invention.

FIG. 18 is a graph showing the reflection coefficient S11 of the integrated circuit according to Embodiment 1 of the present invention. In the present embodiment, the condition satisfied to regard a plane for ground as a line with respect to planes for ground adjacent to the line for ground was examined by an experiment. In FIG. 18, a solid line shows an evaluation result about the reflection coefficient S11 of the integrated circuit 100 according to the present embodiment. In this case, the widths W of the first line 30a and the second line 30b are set to ⅓ of the width S of the planes for ground facing the first line 30a and the second line 30b. The facing plane for ground means, of planes for ground at both the ends of each of the lines for ground, a plane for ground on an input side. Thus, the width W of the first line 30a is set to ⅓ of the width S of the first plane 20a. The width W of the second line 30b is set to ⅓ of the width S of the second plane 20b. The evaluation was performed in a frequency band which is Q band (33 to 50 GHz). In FIG. 18, a broken line indicates an evaluation result about the reflection coefficient S11 of the integrated circuit 800 according to the comparative embodiment.

In the evaluation result shown in FIG. 18, the reflection coefficient S11 of frequency characteristics in the present embodiment is smaller than that in the comparative embodiment. Thus, it is understood that the frequency characteristics of the present embodiment are stable. According to the evaluation result, it was found that, when the width W of the line for ground was ⅓ or less of the width S of the plane for ground, the advantageous effect of the present embodiment could be obtained. At this time, the line for ground is regarded as a line with respect to the planes for ground on both the sides of the line for ground.

In this case, in an actual layout, a line for ground may not be linear. In this case, the length Lg of the line for ground is a length of a center line of the line for ground connecting both the ends of the line for ground to each other.

Figure 19:
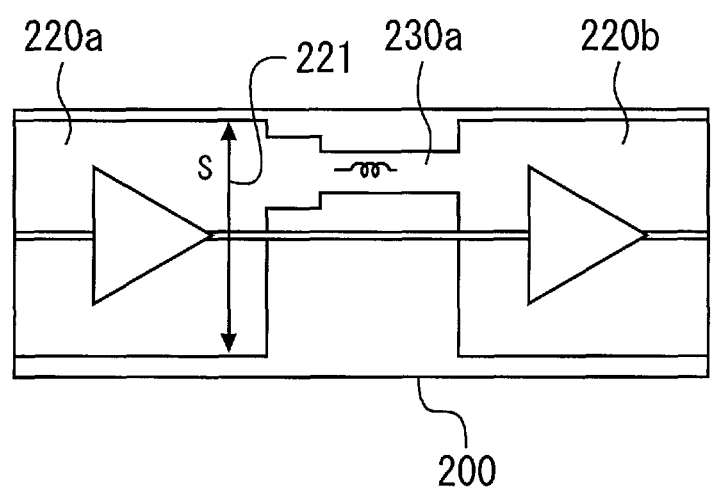
FIGS. 19 to 21 are plan views of an integrated circuit according to modifications of Embodiment 1 of the present invention.

FIG. 19 is a plan view of an integrated circuit according to a modification of Embodiment 1 of the present invention. In the integrated circuit 100, the first plane 20a and the second plane 20b have the uniform width S each. In contrast to this, as in the integrated circuit 200 shown in FIG. 19, the plane for ground need not have a constant width. In the integrated circuit 200 shown in FIG. 19, a first plane 220a for ground has an uneven part at the edge thereof. As described above, when the width of the plane for ground is not constant, the width S of the plane for ground is defined as a maximum size in a direction vertical to a takeoff direction of the line for ground. In the example shown in FIG. 19, the width indicated by an arrow 221 is the width S of the plane for ground.

Figure 20:
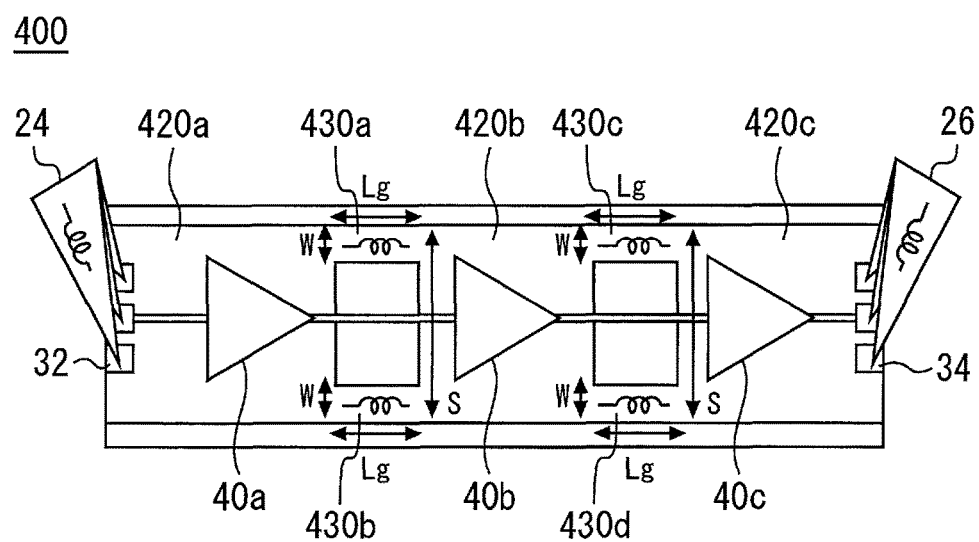

FIG. 20 is a plan view of an integrated circuit according to a modification of Embodiment 1 of the present invention. In the integrated circuit 100, the first plane 20a and the second plane 20b are connected to each other by one line for ground. In contrast to this, the planes for ground need not be connected to each other by only one line for ground. In the integrated circuit 400 shown in FIG. 20, the planes for ground are connected to each other by two lines for ground. A first plane 420a for ground and a second plane 420b for ground are connected to each other by two lines 430a and 430b for ground. Similarly, the second plane 420b and a third plane 420c for ground are connected to each other by two lines 430c and 430d for ground.

Although FIG. 20 shows the structure in which the planes for ground are connected to each other by the two grand lines, the number of lines for ground may be two or more. This structure is advantageously strong to the variation of the planes for ground at a low frequency. The variation of the planes for ground at the low frequency is a variation in potential difference, for example.

As shown in FIG. 20, when the planes for ground are connected to each other by a plurality of lines for ground, inductors are regarded to be connected in parallel with each other in the equivalent circuit. At this time, the width W of the line for ground set by the simulation is replaced with a total sum of widths Wa. The total sum of widths is a sum of the widths of all the lines for ground connecting the planes for ground connected to two continuous amplifier stages. In the integrated circuit 400, the total sum of widths Wa of the lines for ground connecting the first plane 420*a* and the second plane 420*b* is a sum of widths W of the lines 430*a* and 430*b*.

Thus, when the planes for ground are connected to each other by the plurality of lines for ground, the multistage amplifier can be stably operated when a pattern ratio Lg/Wa is 1 or more, the length Lg falls within the range of 10 μm to 1 mm, and the total sum of widths Wa is ⅓ or less of the width S of the plane for ground. In this case, the pattern ratio Lg/Wa is a value obtained by dividing the length Lg of the line for ground by the total sum of widths Wa.

In the present embodiment, different planes for ground are connected to amplifier stages, respectively, and the planes for ground are connected to each other by lines for ground. In contrast to this, of the amplifier stages included in the integrated circuit, two or more amplifier stages may be connected to a common plane for ground. The amplifier stages connected to the common plane for ground may be continuous amplifier stages or discontinuous amplifier stages depending on the restriction of a layout.

Figure 21:
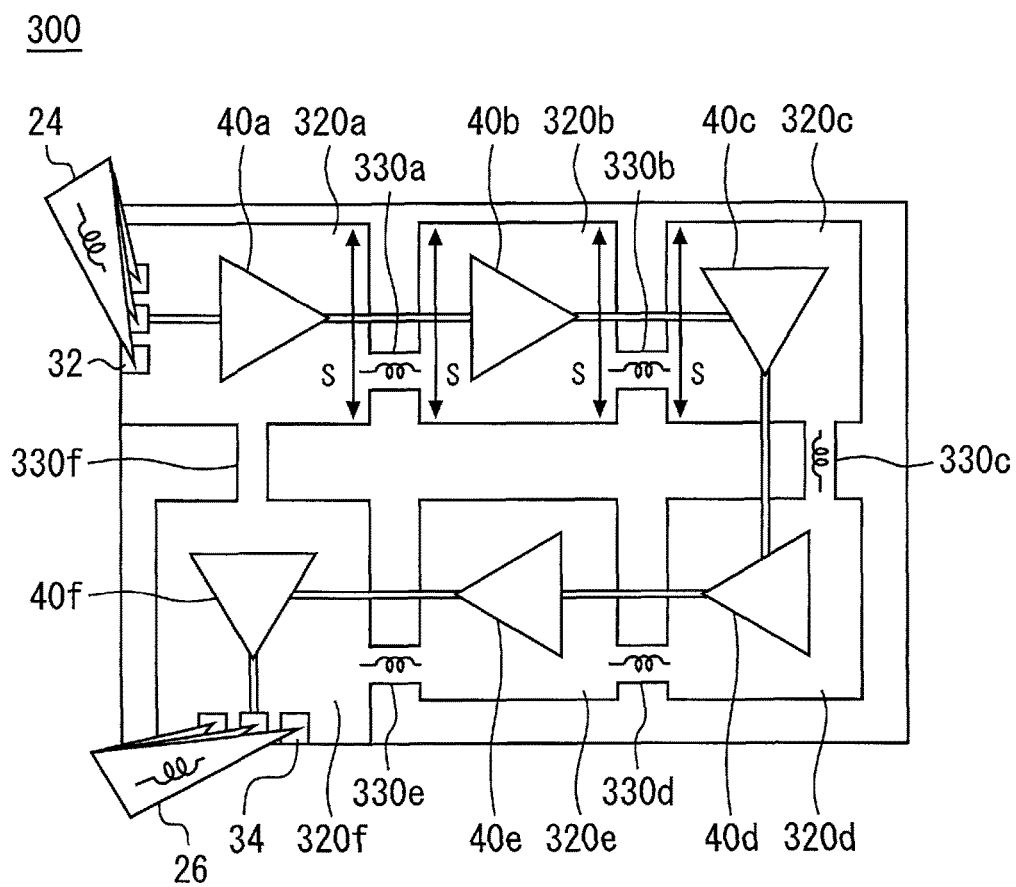

FIG. 21 is a plan view of an integrated circuit according to a modification of Embodiment 1 of the present invention. In the present embodiment, two planes for ground connected to each other by a line for ground is assumed to be connected to continuous amplifier stages. In contrast to this, as shown in FIG. 21, planes for ground connected to discontinuous amplifier stages may be connected to each other by a line for ground. In the modification shown in FIG. 21, the integrated circuit 300 includes first to sixth amplifier stages 40*a* to 40*f*. First to sixth planes 320*a* to 320*f* for ground are connected to the first to the sixth amplifier stages 40*a* to 40*f*, respectively. The first amplifier stage 40*a* and the sixth amplifier stage 40*f* serving as discontinuous amplifier stages are connected to each other by a sixth line 330*f* for ground. In this structure, in comparison with a case in which the sixth line 330*f* is not used, the advantageous effect of stabilization of the circuit operation is weakened. However, the advantageous effect of the present invention can be obtained. The modifications shown in FIGS. 20 and 21 can also be applied to other embodiments.

In each of the integrated circuits 100, 200, 300, and 400 according to the present embodiment, the inductance of a line for ground connecting planes for ground to each other is adjusted to make it possible to stably amplify a high-frequency output signal. Here, it is assumed that the length Lg of the line for ground is 10 μm to 1 mm, that the total sum of widths Wa is ⅓ or less of the width S of a facing plane for ground, and the pattern ratio Lg/Wa is 1 or more. In this case, the integrated circuit can be stably operated without decreasing the gain.

In the present embodiment, the planes for ground are separated from each other, and the planes for ground are connected to each other by the lines for ground. In this configuration, in comparison with a configuration in which all amplifier stages are connected to one plane for ground, a gain of the amplifier stage connected to one plane for ground is small. For this reason, feedback through the plane for ground is suppressed from occurring. Thus, a high-frequency output signal can be stably amplified.

In an integrated circuit manufactured on a semiconductor substrate, a wafer test which is an inspection performed in a wafer state may be generally executed. Here, in a wafer test of a single-phase input/output amplifying circuit manufactured on a GaAs-based semiconductor substrate, a general-purpose GSG (GND-Signal-GND) probe is generally used. In the wafer test, the GSG probe is brought into contact with an input/output pad to perform a measurement. In an integrated circuit in which a plurality of amplifier stages each having a high gain are connected to one plane for ground, the inductance component of a GND needle included in the probe head may destabilize the circuit operation. In a flip-chip mounting, the inductance component the solder balls 7 have may destabilize the operation.

In contrast to this, in the present embodiment, the inductance of the line for ground is adjusted to make it possible to suppress the operation from being destabilized by the inductance component loaded on the ground. Thus, the operation can be suppressed from being destabilized by the inductance component of the probe head or the solder balls connected to the ground. For this reason, an operation in a wafer test or mounting can be stabilized.

In the present embodiment, a flat plane for ground is formed. In contrast to this, the integrated circuit may include a structure in which an opening or a slit is formed in a plane for ground. When the opening or the slit is formed in the plane for ground to form a structure regarded as a line for ground, the advantageous effect of the present invention can be obtained. However, the structure formed by the opening or the slit must satisfy a condition satisfied to regard the line for ground as a line with respect to the plane for ground as shown in FIG. 18.

In an Si process, a structure in which all a plurality of amplifier stages are covered with a ground having a mesh structure may be generally used. Even in the ground having the mesh structure as described above, when the ground is thinned to be regarded as a line at a connection portion between the amplifier stages, the advantageous effect of the present invention can be obtained.

However, the present invention does not include a structure in which two openings are formed in the plane for ground to sandwich a signal line when planarly-viewed, the width of the opening is ¼ a signal wavelength, a signal passing through a portion between the two openings and a signal detouring around the openings are canceled out to suppress feedback of the signals.

As described above, feedback through a plane for ground becomes problematic especially in a multistage amplifier including a single-phase input/output amplifier stage. In this case, the single-phase input amplifier mentioned here means that one input signal is input to the amplifier stage. The single-output amplifier stage means that one output signal is output from the amplifier stage. In the present embodiment, in the first to third amplifier stages 40*a* to 40*c*, signals are input to the gates of the first to third transistors 12*a* to 12*c* and output from the drains thereof. Thus, the first to third amplifier stages 40*a* to 40*c* are single-phase input/output amplifier stages. For this reason, in the present embodiment, the effect of stabilization of an operation obtained by including a line for ground advantageously works.

In each of the integrated circuits 100, 200, 300, and 400 according to the present embodiment is defined as a circuit in which a plurality of amplifier stages amplifying signals are cascade-connected and integrated on the same chip. Here, the present embodiment can also be applied to a circuit except for the multistage amplifier. The present embodiment can be applied to a circuit in which a plurality of functional circuits each processing an input signal from a previous stage and outputting the resultant signal to the next stage are mounted to obtain a large total gain. In this case, different planes for ground are connected to the functional circuits, respectively. The planes for ground are connected to each other by a line for ground as in the present embodiment.

Embodiment 2

Figure 22A:
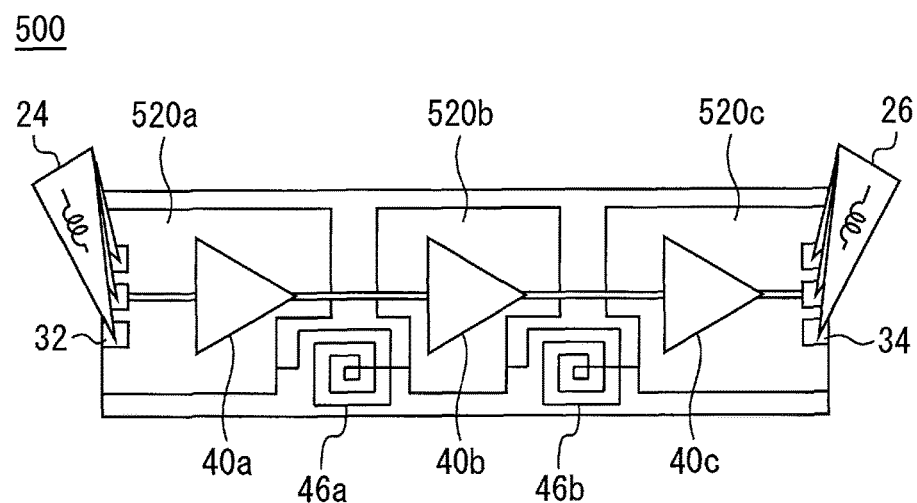
FIG. 22A is a plan view of an integrated circuit according to Embodiment 2 of the present invention.

FIG. 22A is a plan view of an integrated circuit according to Embodiment 2 of the present invention. In the integrated circuit 500 according to the present embodiment, in place of a line for ground, a spiral inductor connects planes for ground to each other. A first plane 520a for ground is connected to the first amplifier stage 40a. A second plane 520b for ground is connected to the second amplifier stage 40b. A third plane 520c for ground is connected to the third amplifier stage 40c. The first plane 520a and the second plane 520b are connected to each other by a first spiral inductor 46a. The second plane 520b and the third plane 520c are connected to each other by a second spiral inductor 46b.

Figure 22B:
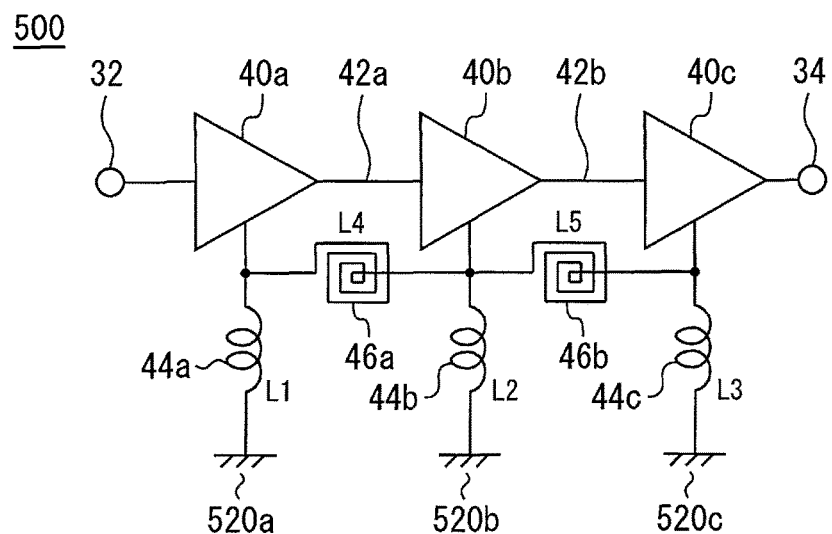
FIG. 22B is an equivalent circuit diagram of the integrated circuit according to Embodiment 2 of the present invention.

FIG. 22B is an equivalent circuit diagram of the integrated circuit according to Embodiment 2 of the present invention. The first spiral inductor 46a and the second spiral inductor 46b satisfy the conditions about the line for ground described in Embodiment 1. Thus, with respect to each of the spiral inductors, it is assumed that the length Lg falls within the range of 10 μm to 1 mm, the total sum of widths Wa is ⅓ or less of the width S of the plane for ground, and the pattern ratio Lg/Wa is 1 or more. In this case, the integrated circuit 500 can be stably operated.

The first spiral inductor 46a and the second spiral inductor 46b are disposed on the layer on which the first to third planes 520a to 520c are disposed. Each of the spiral inductors and each of the planes for ground are manufactured by patterning one metal layer. In this case, a wire is taken from an end at the center of each of the spiral inductors by using a metal wire of a different layer.

In the integrated circuit 100 described in Embodiment 1, when an applied frequency is low, the inductors L4 and L5 may have to have large inductance values to stabilize an operation. At this time, the length Lg of the line for ground must be increased. Thus, the chip size increases. In the present embodiment, the inductors L4 and L5 are configured as spiral inductors, respectively. For this reason, an interval between the planes for ground can be shortened. Thus, the integrated circuit 500 can be miniaturized.

Embodiment 3

Figure 23A:
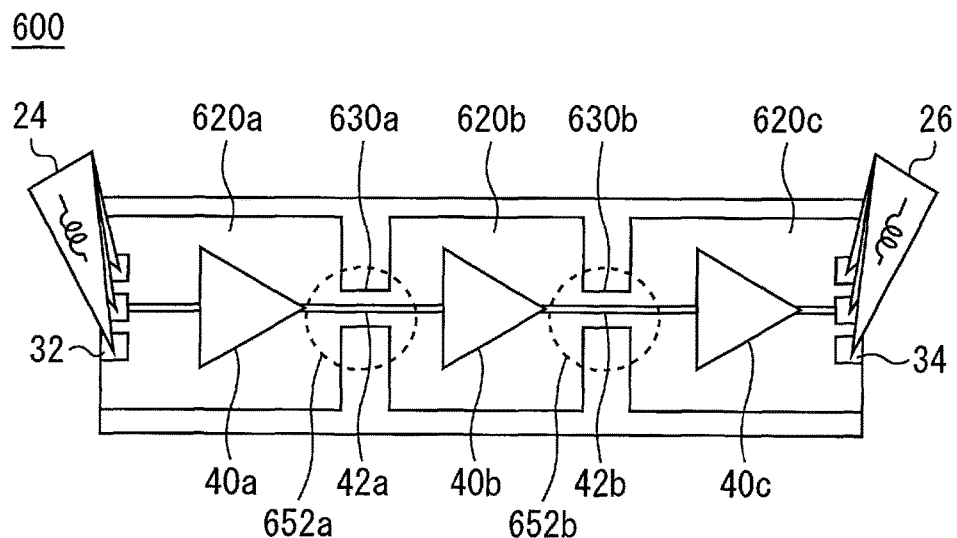
FIG. 23A is a plan view of an integrated circuit according to Embodiment 3 of the present invention.
Figure 23B:
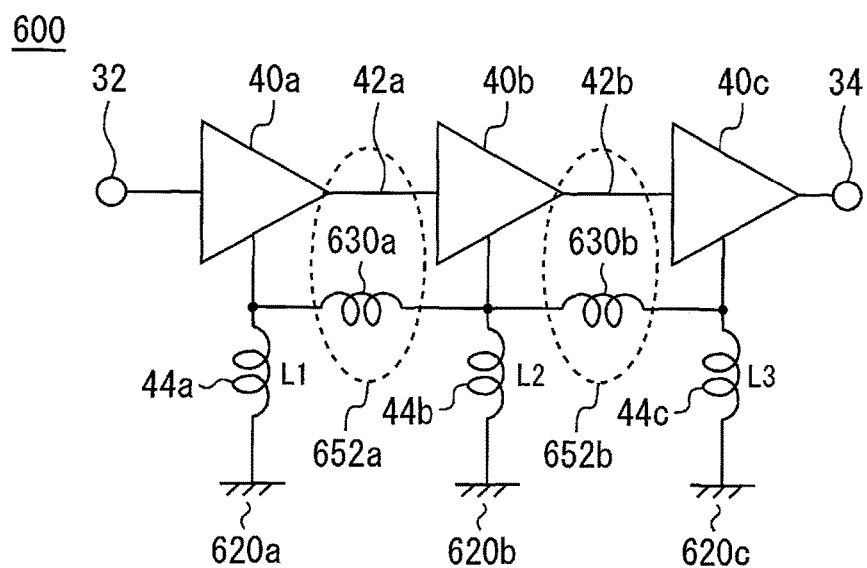
FIG. 23B is an equivalent circuit diagram of the integrated circuit according to Embodiment 3 of the present invention.

FIG. 23A is a plan view of an integrated circuit according to Embodiment 3 of the present invention. FIG. 23B is an equivalent circuit diagram of the integrated circuit according to Embodiment 3 of the present invention. The integrated circuit 600 according to the present embodiment is disposed such that a line for ground overlaps a signal line. A first line 630a for ground is disposed to overlap the first signal line 42a. A second line 630b for ground is disposed to overlap the second signal line 42b.

Figure 24:
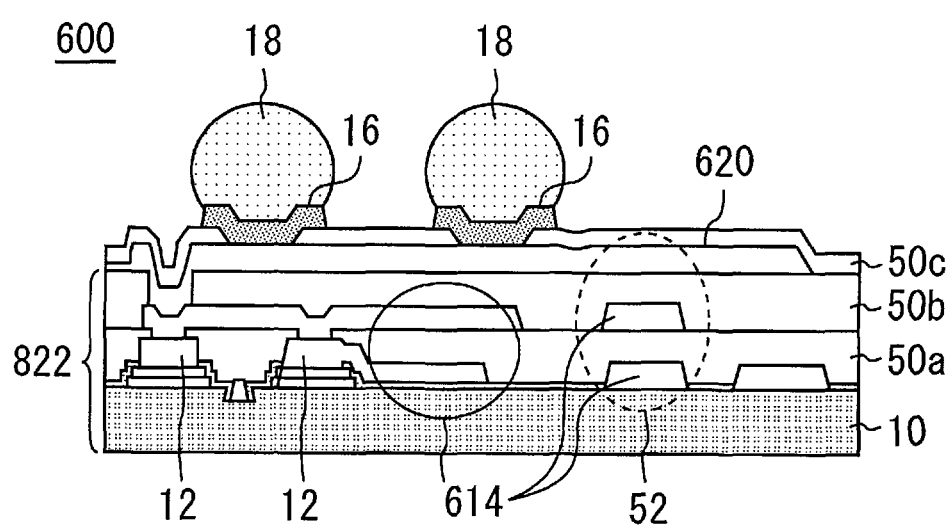
FIG. 24 is a sectional view of the integrated circuit according to Embodiment 3 of the present invention.

FIG. 24 is a sectional view of the integrated circuit according to Embodiment 3 of the present invention. Like the integrated circuit 100, the integrated circuit 600 has a structure in which dielectric films 50a and 50b are sandwiched between layers, i.e., a wiring layer 614 and a layer 620 for ground. The layer 620 includes first to third planes 620a to 620c for ground, the first line 630a, and the second line 630b. The wiring layer 614 includes the first signal line 42a and the second signal line 42b. In this structure, at a position where the lines for ground are disposed to overlap the signal lines, a micro-strip line 52 is formed.

In FIG. 23A and FIG. 23B, the first line 630a, the first signal line 42a, and a dielectric film formed therebetween form a first micro-strip line 652. Similarly, the second line 630b, the second signal line 42b, and a dielectric film formed therebetween form a second micro-strip line 652b.

In the present embodiment, the first micro-strip line 652a and the second micros-strip line 652b are formed to make it possible to specify the characteristic impedances of the first signal line 42a and the second signal line 42b. In Embodiment 1, each of the signal lines has a large inductance component. For this reason, each of the signal lines has a high impedance. At this time, when the signal lines become long, matching between the amplifier stages is difficult to be achieved. In contrast to this, in this embodiment, each of the signal lines is a transmission line having a characteristic impedance. For this reason, even though the signal lines are long, matching between the amplifier stages can be easily designed. Thus, the degree of freedom of the layout can be improved.

Embodiment 4

Figure 25A:
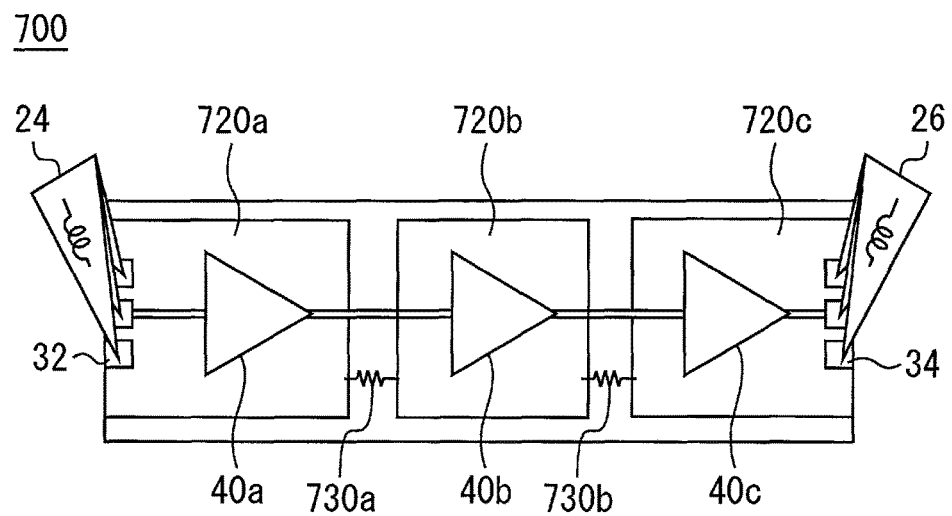
FIG. 25A is a plan view of an integrated circuit according to Embodiment 4 of the present invention.

FIG. 25A is a plan view of an integrated circuit according to Embodiment 4 of the present invention. In this embodiment, in place of a line for ground, a resistive device connects planes for ground to each other. A first plane 720a for ground and a second plane 720b for ground are connected to each other by a first resistive device 730a. The second plane 720b and a third plane 720c for ground are connected to each other by a second resistive device 730b.

Figure 25B:
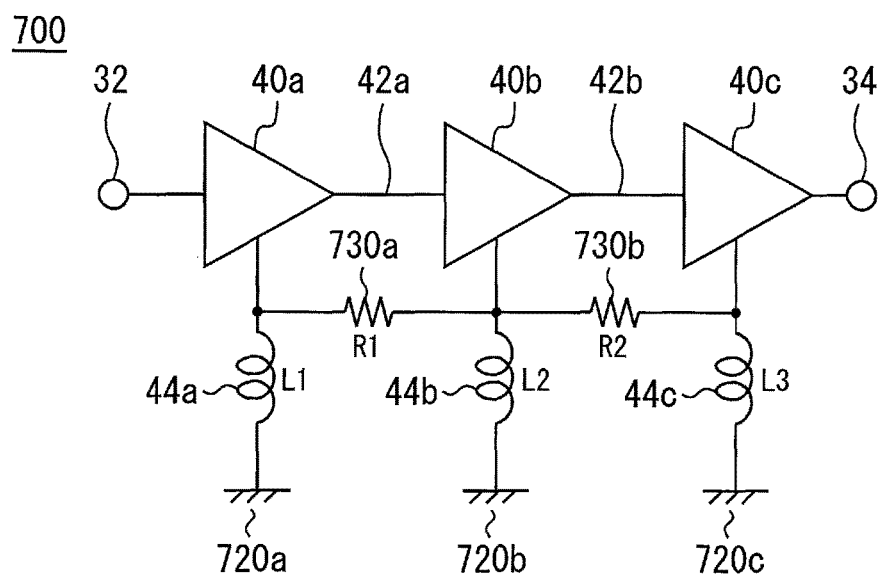
FIG. 25B is an equivalent circuit diagram of the integrated circuit according to Embodiment 4 of the present invention.

FIG. 25B is an equivalent circuit diagram of the integrated circuit according to Embodiment 4 of the present invention. In Embodiment 1, the planes for ground are connected to each other through the line for ground having a sufficiently high impedance at an applied frequency to make it possible to stably operate the multistage amplifier. In the present embodiment, in place of a line for ground, a resistive device having a sufficiently high impedance at an applied frequency is used to stabilize the operation. In order to obtain a condition which should be satisfied by the resistive device to stabilize the operation of the integrated circuit 700, simulation is performed by using the equivalent circuit shown in FIG. 25B.

Figure 26:
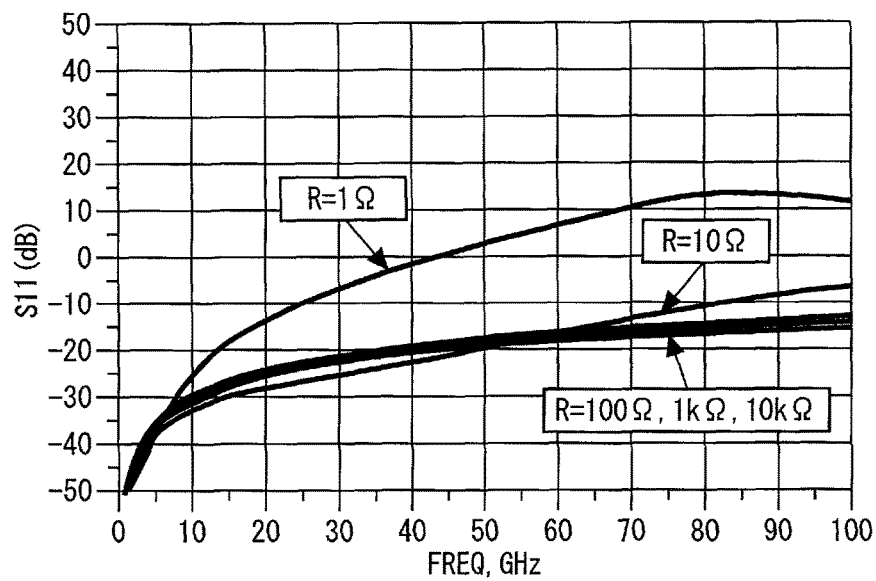
FIG. 26 is a graph showing a reflection coefficient S11 of the integrated circuit according to Embodiment 4 of the present invention.
Figure 27:
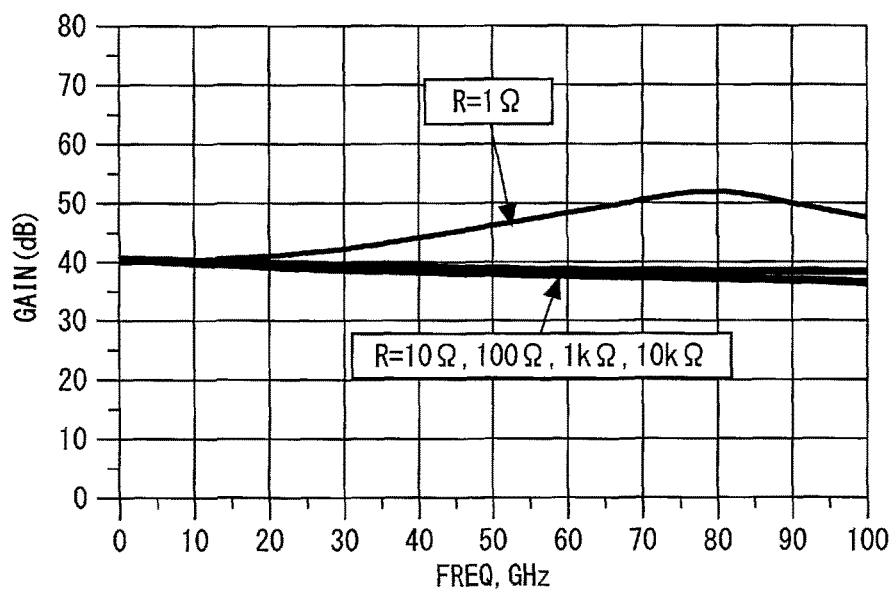
FIG. 27 is a graph showing a gain of the integrated circuit according to Embodiment 4 of the present invention.
Figure 28:
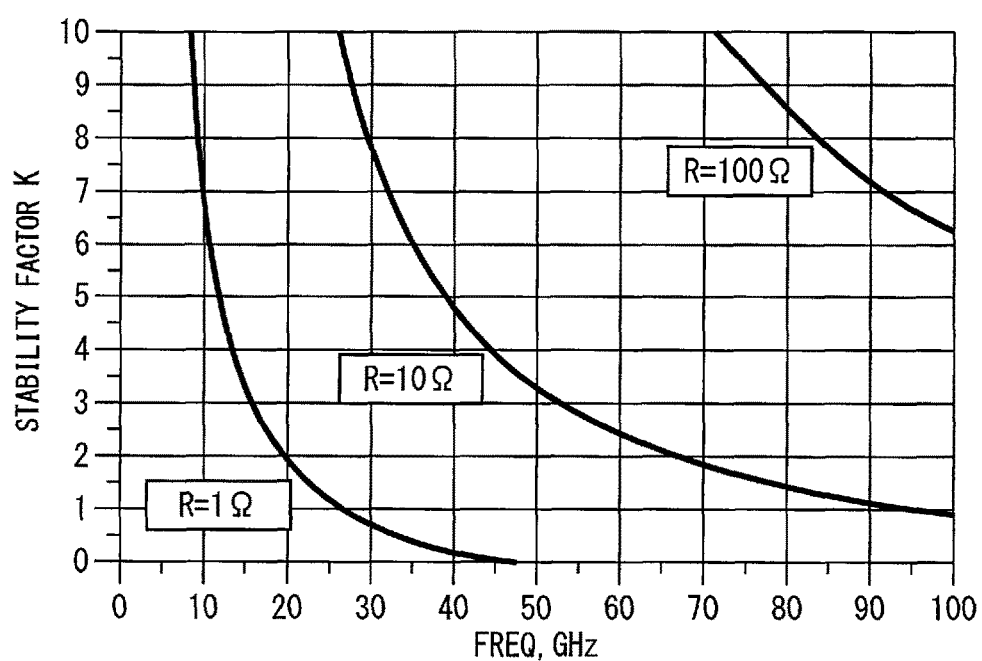
FIG. 28 is a graph showing a stability factor K of the integrated circuit according to Embodiment 4 of the present invention.

FIGS. 26 to 28 show simulation results about the reflection coefficient S11, the gain G, and the stability factor K of the integrated circuit 700. FIG. 26 is a graph showing the reflection coefficient S11 of the integrated circuit according to Embodiment 4 of the present invention. FIG. 27 is a graph showing the gain of the integrated circuit according to Embodiment 4 of the present invention. FIG. 28 is a graph showing the stability factor K of the integrated circuit according to Embodiment 4 of the present invention. As shown in FIGS. 26 to 28, the resistances of the first resistive device 730a and the second resistive device 730b are 10Ω or more, a reflection gain is suppressed, and the stability factor K becomes 1 or more. For this reason, when the resistances of the first resistive device 730a and the second resistive device 730b are 10Ω or more, a stable circuit operation can be achieved.

When a resistive device is used to connect planes for ground to each other, in comparison with connection by a line for ground, the integrated circuit 700 can be miniaturized.

In the integrated circuit according to the present invention, a first plane for ground is connected to a first amplifier stage, and a second plane for ground is connected to a second amplifier stage. Thus, the integrated circuit has a structure in which planes for ground are separated from each other in units of amplifier stages. In a multistage amplifier, a reactance component between each amplifier and a plane for ground acts on one plane for ground to destabilize the operation. For this reason, the planes for ground connected to the amplifier stages are separated from each other to make it possible to stabilize the operation. Furthermore, an impedance component between the planes for ground is adjusted to make it possible to stabilize the operation of the multistage amplifier even in the configuration in which the planes for ground are connected to each other by a line for ground. In the present invention, an inductance component between the planes for ground is determined depending on the length and the width of the line for ground. It is assumed that a center line of the line for ground has a length of 10 µm to 1 mm, a width of the line for ground is ⅓ or less of a width of the first plane, and a pattern ratio which is a value obtained by dividing the length of the center line by the width of the line for ground is 1 or more. In this case, the multistage amplifier can be stably operated. In this configuration, feedback through the planes for ground can be suppressed without separating chip mounting patterns from each other.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2016-084659, filed on Apr. 20, 2016 including specification, claims, drawings and summary, on which the Convention priority of the present application is based, are incorporated herein by reference in its entirety.

The invention claimed is:

1. An integrated circuit comprising:
    a first amplifier stage;
    a second amplifier stage;
    a first signal line connecting an output of the first amplifier stage and an input of the second amplifier stage to each other;
    a first plane for ground connected to the first amplifier stage;
    a second plane for ground connected to the second amplifier stage; and
    at least one line for ground connecting the first plane and the second plane to each other, the at least one line being disposed to overlap the first signal line,
    wherein the at least one line has a center line having a length of 10 µm to 1 mm, a width of the at least one line is ⅓ or less of a width of the first plane, and a pattern ratio which is a value obtained by dividing the length of the center line by the width of the at least one line is 1 or more.

2. The integrated circuit according to claim 1, wherein the first amplifier stage and the second amplifier stage include a single-phase input and a single-phase output each.

3. The integrated circuit according to claim 1, further comprising:
    a semiconductor substrate having a surface on which the first amplifier stage, the second amplifier stage, and the first signal line are formed;
    a dielectric film disposed between the first amplifier stage, the second amplifier stage and the first signal line and the first plane and the second plane;
    a first connection structure connecting the first amplifier stage and the first plane to each other; and
    a second connection structure connecting the second amplifier stage and the second plane to each other.

4. The integrated circuit according to claim 3, wherein the first plane and the second plane are disposed on the dielectric film and on an uppermost surface side of the semiconductor substrate to cover the first amplifier stage and the second amplifier stage.

5. The integrated circuit according to claim 1,
    wherein
    a dielectric film is disposed between the at least one line and the first signal line, and
    the at least one line, the dielectric film, and the first signal line form a first micro-strip line.

6. The integrated circuit according to claim 1, wherein the at least one line includes a first spiral inductor.

7. The integrated circuit according to claim 1, wherein the at least one line includes a first resistive device having a resistance of 10Ω or more.

* * * * *